(12) United States Patent
Seo et al.

(10) Patent No.: US 11,444,140 B2
(45) Date of Patent: Sep. 13, 2022

(54) DISPLAY APPARATUS AND METHOD OF MANUFACTURING THE SAME

(71) Applicant: SAMSUNG DISPLAY CO., LTD., Yongin-si (KR)

(72) Inventors: Junghan Seo, Yongin-si (KR); Wooyong Sung, Yongin-si (KR); Wooyoung Kim, Yongin-si (KR); Seungyong Song, Yongin-si (KR); Sunghoon Yang, Yongin-si (KR); Kwanhyuck Yoon, Yongin-si (KR); Seunggun Chae, Yongin-si (KR); Wonwoo Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 206 days.

(21) Appl. No.: 16/991,492

(22) Filed: Aug. 12, 2020

(65) Prior Publication Data
US 2021/0066418 A1 Mar. 4, 2021

(30) Foreign Application Priority Data
Sep. 4, 2019 (KR) .................... 10-2019-0109576

(51) Int. Cl.
*H01L 27/32* (2006.01)
*H01L 51/52* (2006.01)
*H01L 51/56* (2006.01)

(52) U.S. Cl.
CPC ...... *H01L 27/3246* (2013.01); *H01L 27/3276* (2013.01); *H01L 51/5253* (2013.01);
(Continued)

(58) Field of Classification Search
CPC ............. H01L 27/3246; H01L 27/3276; H01L 51/5253; H01L 51/56; H01L 2227/323; H01L 2251/301
See application file for complete search history.

(56) References Cited

U.S. PATENT DOCUMENTS 7,154,154 B2 12/2006 Lee et al.
9,111,887 B2 8/2015 Kim et al.
(Continued)

FOREIGN PATENT DOCUMENTS

CN 106783881 5/2017
CN 106935728 7/2017
(Continued)

*Primary Examiner* — Shaun M Campbell
(74) *Attorney, Agent, or Firm* — F. Chau & Associates, LLC

(57) ABSTRACT

A display apparatus includes a substrate, a display area disposed on the substrate and including a plurality of pixels, a first planarization layer disposed on the substrate, a second planarization layer disposed on the first planarization layer, a pixel-defining layer disposed on the second planarization layer and covering at least one edge of a first electrode of each of the plurality of pixels, a plurality of first holes disposed between the plurality of pixels and spaced apart from the first electrode, and a first etching prevention layer disposed on a bottom surface of each of the first holes and on the first planarization layer. Each of the first holes includes an opening that passes through the second planarization layer and the pixel-defining layer.

26 Claims, 26 Drawing Sheets

(52) U.S. Cl.
CPC ........ *H01L 51/56* (2013.01); *H01L 2227/323* (2013.01); *H01L 2251/301* (2013.01)

(56) References Cited

U.S. PATENT DOCUMENTS

| | | | |
|---|---|---|---|
| 9,923,147 B2 | 3/2018 | Kim et al. | |
| 9,978,818 B2 | 5/2018 | Xiong et al. | |
| 2014/0312323 A1* | 10/2014 | Park | H01L 27/3279 438/23 |
| 2016/0013436 A1* | 1/2016 | Im | H01L 27/3276 257/40 |
| 2016/0322598 A1 | 11/2016 | Kim et al. | |
| 2018/0122871 A1 | 5/2018 | Choi | |
| 2018/0122877 A1* | 5/2018 | Beak | H01L 51/5212 |
| 2018/0159077 A1* | 6/2018 | Lee | H01L 51/5253 |
| 2019/0131378 A1* | 5/2019 | Sung | H01L 27/3272 |
| 2019/0181205 A1* | 6/2019 | Kim | H01L 27/3276 |
| 2019/0237703 A1 | 8/2019 | Kim et al. | |

FOREIGN PATENT DOCUMENTS

| | | |
|---|---|---|
| KR | 10-0572316 | 4/2006 |
| KR | 10-2016-0129191 | 11/2016 |
| KR | 10-2017-0019397 | 2/2017 |
| KR | 10-2017-0128742 | 11/2017 |
| KR | 10-1801913 | 11/2017 |
| KR | 10-2018-0047605 | 5/2018 |
| KR | 10-2018-0064601 | 6/2018 |
| KR | 10-1930030 | 12/2018 |
| KR | 10-2019-0093830 | 8/2019 |
| KR | 10-2020-0002051 | 1/2020 |
| KR | 10-2121257 | 6/2020 |

* cited by examiner ized layer disposed on the substrate, a second planarization layer disposed on the first planarization layer, a pixel-defining layer disposed on the second planarization layer and covering at least one edge of a first electrode of each of the plurality of pixels, a plurality of first holes disposed between the plurality of pixels and spaced apart from the first electrode, and a first etching prevention layer disposed on a bottom surface of each of the first holes and on the first planarization layer. Each of the first holes includes an opening that passes through the second planarization layer and the pixel-defining layer.

DISPLAY APPARATUS AND METHOD OF MANUFACTURING THE SAME

CROSS-REFERENCE TO RELATED APPLICATIONS

This application claims priority under 35 U.S.C. § 119 to Korean Patent Application No. 10-2019-0109576, filed on Sep. 4, 2019 in the Korean Intellectual Property Office, the disclosure of which is incorporated by reference herein in its entirety.

TECHNICAL FIELD

Exemplary embodiments include a display apparatus and a method of manufacturing the same.

DISCUSSION OF THE RELATED ART

Display apparatuses are apparatuses that display data visually. Recently, the use of display apparatuses has diversified, and the thickness and weight of display apparatuses have decreased, thus broadening the range of use of display apparatuses.

To protect a display area of a display apparatus from external moisture and impurities, the display area is encapsulated with an encapsulation member. As the demand for thin and flexible display apparatuses has increased recently, there is a tendency to use a thin-film encapsulation layer including a flexible organic insulating film and/or an inorganic insulating film that is not metal or glass.

SUMMARY

Defects in which a thin-film encapsulation layer peels off from a back plane of a display apparatus may occur in a subsequent process after the thin-film encapsulation layer is formed. For example, such defects may occur in a process of forming a touch sensor layer on the thin-film encapsulation layer or a process of removing a protective film adhered onto the thin-film encapsulation layer after a polarization film is attached.

Exemplary embodiments include a display apparatus that may reduce defects in which a thin-film encapsulation layer peels off from the back plane, and a method of manufacturing the same. However, these objectives are just examples, and the scope of the present disclosure is not limited thereto.

According to an exemplary embodiment, a display apparatus includes a substrate, a display area disposed on the substrate and comprising a plurality of pixels, a first planar- In an exemplary embodiment, a first width of the opening formed in the pixel-defining layer is less than a second width of the opening formed in the second planarization layer at a boundary surface between the pixel-defining layer and the second planarization layer.

In an exemplary embodiment, the display apparatus further includes a second etching prevention layer disposed between the second planarization layer and the pixel-defining layer.

In an exemplary embodiment, the display apparatus further includes a third etching prevention layer disposed on the second etching prevention layer.

In an exemplary embodiment, each of the pixels includes an intermediate layer disposed on the first electrode, and a second electrode disposed on the intermediate layer. The intermediate layer includes an emission layer, and the intermediate layer and the second electrode are disposed inside each of the first holes.

In an exemplary embodiment, the emission layer is disposed on the first electrode and is not disposed inside each of the first holes.

In an exemplary embodiment, the display apparatus further includes a thin-film encapsulation layer encapsulating the plurality of pixels. The thin-film encapsulation layer includes a first inorganic encapsulation layer, a second inorganic encapsulation layer, and an organic encapsulation layer disposed between the first inorganic encapsulation layer and the second inorganic encapsulation layer. The first inorganic encapsulation layer covers an entirety of the second electrode inside each of the first holes and inner surfaces of each of the first holes, and an entirety of each of the first holes is filled by the organic encapsulation layer.

In an exemplary embodiment, the display apparatus further includes a thin-film transistor disposed between the substrate and the first planarization layer, and a connection line disposed between the first planarization layer and the second planarization layer and connecting the thin-film transistor to the first electrode. The connection line includes a same material as the first etching prevention layer.

In an exemplary embodiment, the display apparatus further includes a plurality of second holes that pass through the second planarization layer and the pixel-defining layer in a non-display area disposed outside the display area, and a second etching prevention layer disposed on a bottom surface of each of the second holes and the first planarization layer. The first planarization layer, the second planarization layer, and the pixel-defining layer extend into the non-display area.

In an exemplary embodiment, the intermediate layer and the second electrode extend into the non-display area, and the intermediate layer and the second electrode are disposed inside each of the second holes.

In an exemplary embodiment, the first inorganic encapsulation layer, the organic encapsulation layer, and the second inorganic encapsulation layer extend into the non-display area. The first inorganic encapsulation layer covers an entirety of the second electrode inside each of the second holes and inner surfaces of each of the second holes. An entirety of each of the second holes is filled by the organic encapsulation layer.

In an exemplary embodiment, the display apparatus further includes a power supply voltage line disposed in the non-display area and surrounding a part of the display area. The second electrode that extends into the non-display area is electrically connected to the power supply voltage line.

In an exemplary embodiment, the display apparatus further includes a first dam part and a second dam part disposed outside the display area. The first dam part and the second dam part each include layers including a same material as the second planarization layer and the pixel-defining layer. The second dam part clads ends of the power supply voltage line.

In an exemplary embodiment, the display apparatus further includes a second etching prevention layer disposed between the second planarization layer and the pixel-defining layer.

In an exemplary embodiment, a first width of the opening formed in the pixel-defining layer and a second width of the opening formed in the second planarization layer are about equal to each other at a boundary surface between the pixel-defining layer and the second planarization layer.

According to an exemplary embodiment, a display apparatus includes a substrate, and a display area disposed on the substrate and including a plurality of pixels. Each of the plurality of pixels includes a first electrode, a second electrode, and an intermediate layer disposed between the first electrode and the second electrode. The intermediate layer includes an emission layer. The display apparatus further includes a thin-film encapsulation layer encapsulating the plurality of pixels, and including a first inorganic encapsulation layer, a second inorganic encapsulation layer, and an organic encapsulation layer disposed between the first inorganic encapsulation layer and the second inorganic encapsulation layer. The display apparatus further includes a non-display area disposed outside the display area, a first planarization layer extending from the display area into the non-display area and disposed between the substrate and the first electrode, a second planarization layer extending from the display area into the non-display area and disposed on the first planarization layer, a pixel-defining layer covering at least one edge of the first electrode, extending from the display area into the non-display area, and disposed on the second planarization layer, and a plurality of holes disposed in the non-display area. Each of the holes includes an opening that passes through the second planarization layer and the pixel-defining layer. The display apparatus further includes a first etching prevention layer disposed on the first planarization layer under the holes. The intermediate layer and the second electrode extend into the non-display area and are disposed inside each of the holes. The first inorganic encapsulation layer extends into the non-display area and covers an entirety of the second electrode inside each of the holes and inner surfaces of each of the holes. An entirety of each of the holes is filled by the organic encapsulation layer.

In an exemplary embodiment, the display apparatus further includes a first dam part and a second dam part each including at least one layer including a same material as the second planarization layer and the pixel-defining layer. The first inorganic encapsulation layer extends from the holes and covers the first dam part and the second dam part, and is in direct contact with the second inorganic encapsulation layer outside the second dam part.

According to an exemplary embodiment, a method of manufacturing a display apparatus includes forming a first planarization layer on a substrate, forming a first etching prevention layer on the first planarization layer, forming a second planarization layer on the first etching prevention layer, forming a pixel-defining layer on the second planarization layer, and forming a plurality of first holes that pass through the second planarization layer and the pixel-defining layer in a display area. The display area is disposed on the substrate and includes a plurality of pixels. Each of the pixels includes a first electrode, a second electrode, and an intermediate layer including an emission layer and disposed between the first electrode and the second electrode. The display apparatus includes a thin-film encapsulation layer encapsulating the display area and including a first inorganic encapsulation layer, a second inorganic encapsulation layer, and an organic encapsulation layer disposed between the first inorganic encapsulation layer and the second inorganic encapsulation layer. The intermediate layer and the second electrode are formed on a top surface of the first etching prevention layer and a top surface of the pixel-defining layer. The first inorganic encapsulation layer covers an entirety of the second electrode inside each of the first holes and inner surfaces of each of the first holes, and an entirety of each of the first holes is filled by the organic encapsulation layer.

In an exemplary embodiment, the method further includes forming a first contact hole in the pixel-defining layer, and forming a barrier layer on the pixel-defining layer. The barrier layer surrounds the first contact hole, and the first holes are formed by dry etching the second planarization layer and the pixel-defining layer.

In an exemplary embodiment, the method further includes removing the barrier layer by wet etching after the first holes are formed.

In an exemplary embodiment, the method further includes forming a second etching prevention layer between the second planarization layer and the pixel-defining layer.

In an exemplary embodiment, the second etching prevention layer is formed simultaneously with the first electrode.

In an exemplary embodiment, the method further includes forming a third etching prevention layer on the second etching prevention layer.

In an exemplary embodiment, the method further includes forming a plurality of second holes that pass through the second planarization layer and the pixel-defining layer, and forming a second etching prevention layer on a bottom surface of each of the second holes and on the first planarization layer. The first planarization layer, the second planarization layer, and the pixel-defining layer extend into a non-display area disposed outside the display area.

In an exemplary embodiment, the intermediate layer and the second electrode are formed on a top surface of the second etching prevention layer and a top surface of the pixel-defining layer. The first inorganic encapsulation layer covers an entirety of the second electrode inside each of the second holes and inner surfaces of each of the second holes, and an entirety of each of the second holes is filled by the organic encapsulation layer.

In an exemplary embodiment, the first holes are formed by irradiating a location corresponding to the first etching prevention layer with a laser.

BRIEF DESCRIPTION OF THE DRAWINGS

The above and other features of the present disclosure will become more apparent by describing in detail exemplary embodiments thereof with reference to the accompanying drawings, in which.

DETAILED DESCRIPTION

Figure 1:
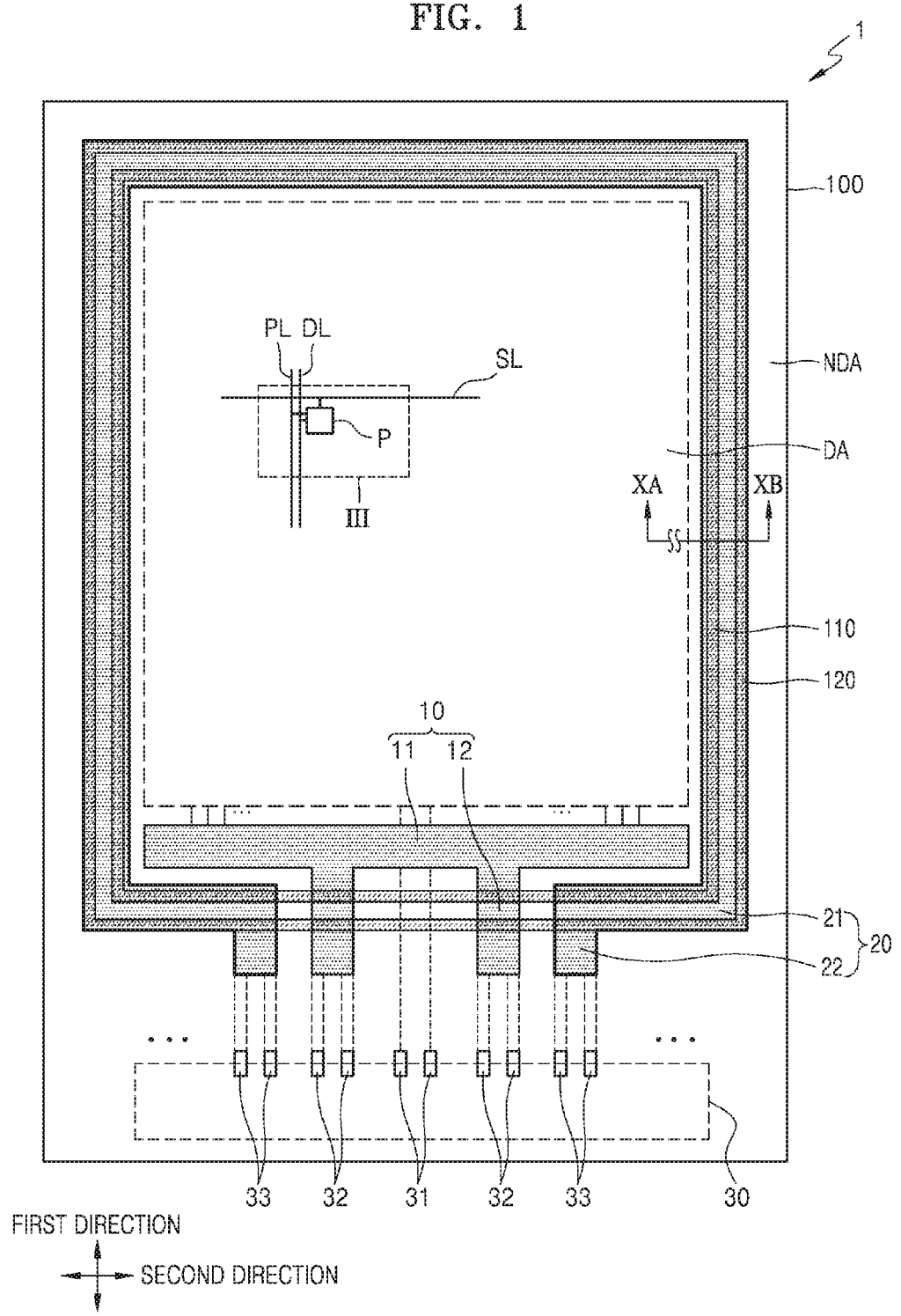
FIG. 1 is a plan view schematically illustrating a display apparatus according to an exemplary embodiment.

Exemplary embodiments will be described more fully hereinafter with reference to the accompanying drawings. Like reference numerals may refer to like elements throughout the accompanying drawings.

As used herein, the term "and/or" includes any and all combinations of one or more of the associated listed items. Throughout the disclosure, the expression "at least one of a, b or c" and the expression "at least one of a, b and c" indicate only a, only b, only c, both a and b, both a and c, both b and c, all of a, b, and c, or variations thereof.

It will be understood that although the terms "first," "second," etc. may be used herein to describe various elements, these elements should not be limited by these terms. Thus, a "first" element in an exemplary embodiment may be described as a "second" element in another exemplary embodiment.

As used herein, the singular forms "a," "an," and "the" are intended to include the plural forms as well, unless the context clearly indicates otherwise.

It will be further understood that the terms "comprises" and/or "comprising" used herein specify the presence of stated features or elements, but do not preclude the presence or addition of one or more other features or elements.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. For example, it will be understood that when a layer, region, or element is referred to as being "electrically connected to" another layer, region, or element, it may be directly or indirectly electrically connected to the other layer, region, or element. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationship between elements should be interpreted in a like fashion.

When a certain exemplary embodiment may be implemented differently, a specific process order may be performed differently from the described order. For example, two consecutively described processes may be performed substantially at the same time or performed in an order opposite to the described order.

Herein, when one value is described as being about equal to another value or being substantially the same as or equal to another value, it is to be understood that the values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Examples of display apparatuses that display an image and that can be utilized in the exemplary embodiments described herein may include, for example, liquid crystal display (LCD) apparatuses, electrophoretic display apparatuses, organic light-emitting diode (OLED) display apparatuses, inorganic electroluminescence (EL) display apparatuses, field emission display apparatuses, surface-conduction electron-emitter display apparatuses, plasma display apparatuses, and cathode-ray tube display apparatuses.

Hereinafter, an organic light-emitting diode (OLED) display apparatus will be described as an example of a display apparatus according to exemplary embodiments. However, the display apparatus according to exemplary embodiments is not limited thereto, and a variety of types of display apparatuses may be used, including, but not limited to, the types of display apparatuses described above.

Figure 2A:
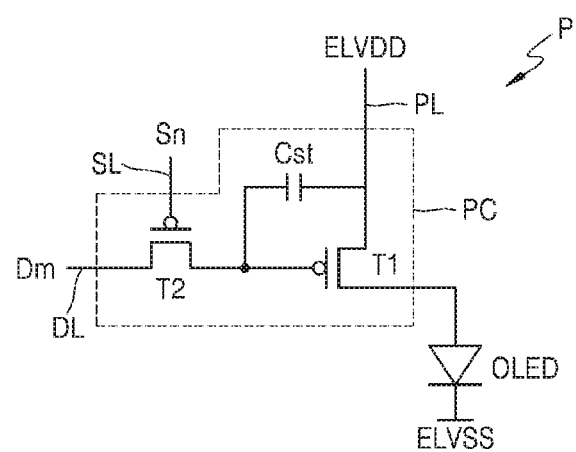
FIGS. 2A and 2B are equivalent circuit diagrams of one pixel included in a display apparatus according to an exemplary embodiment.
Figure 2B:
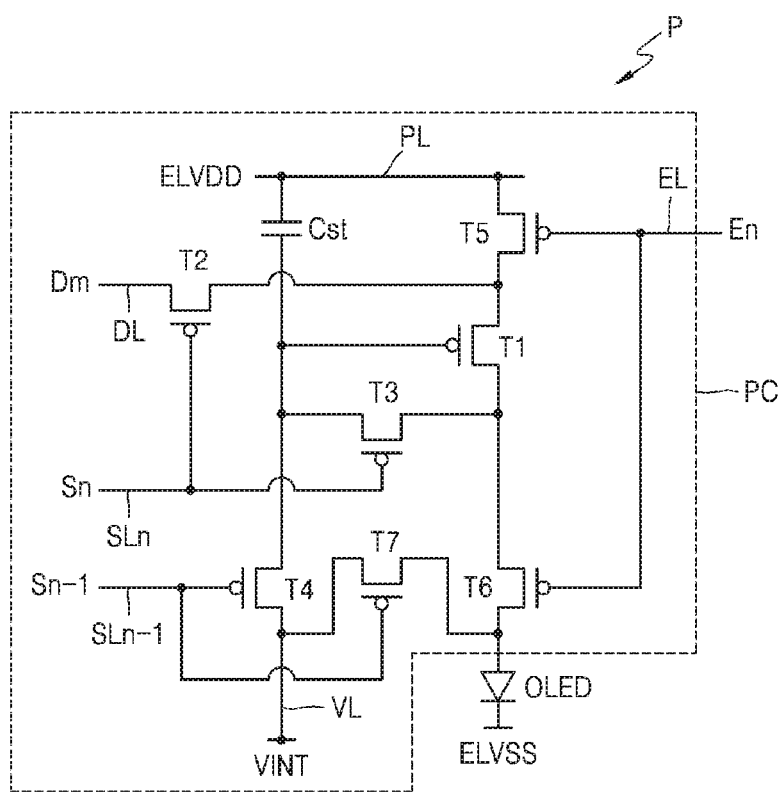
Figure 3:
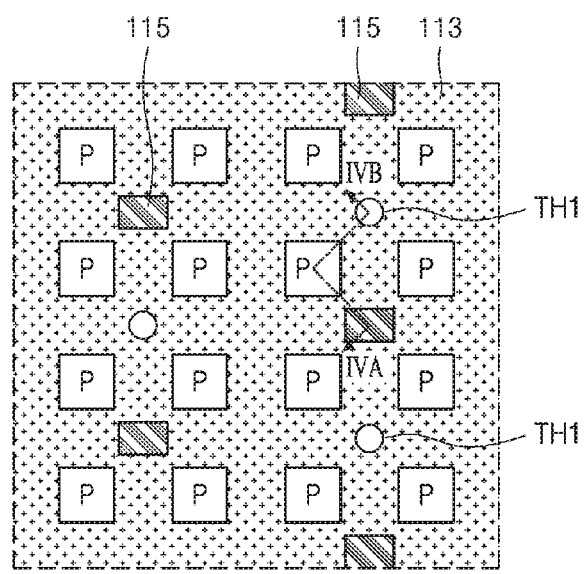
FIG. 3 is a plan view schematically illustrating region III of FIG. 1 according to an exemplary embodiment.
Figure 4:
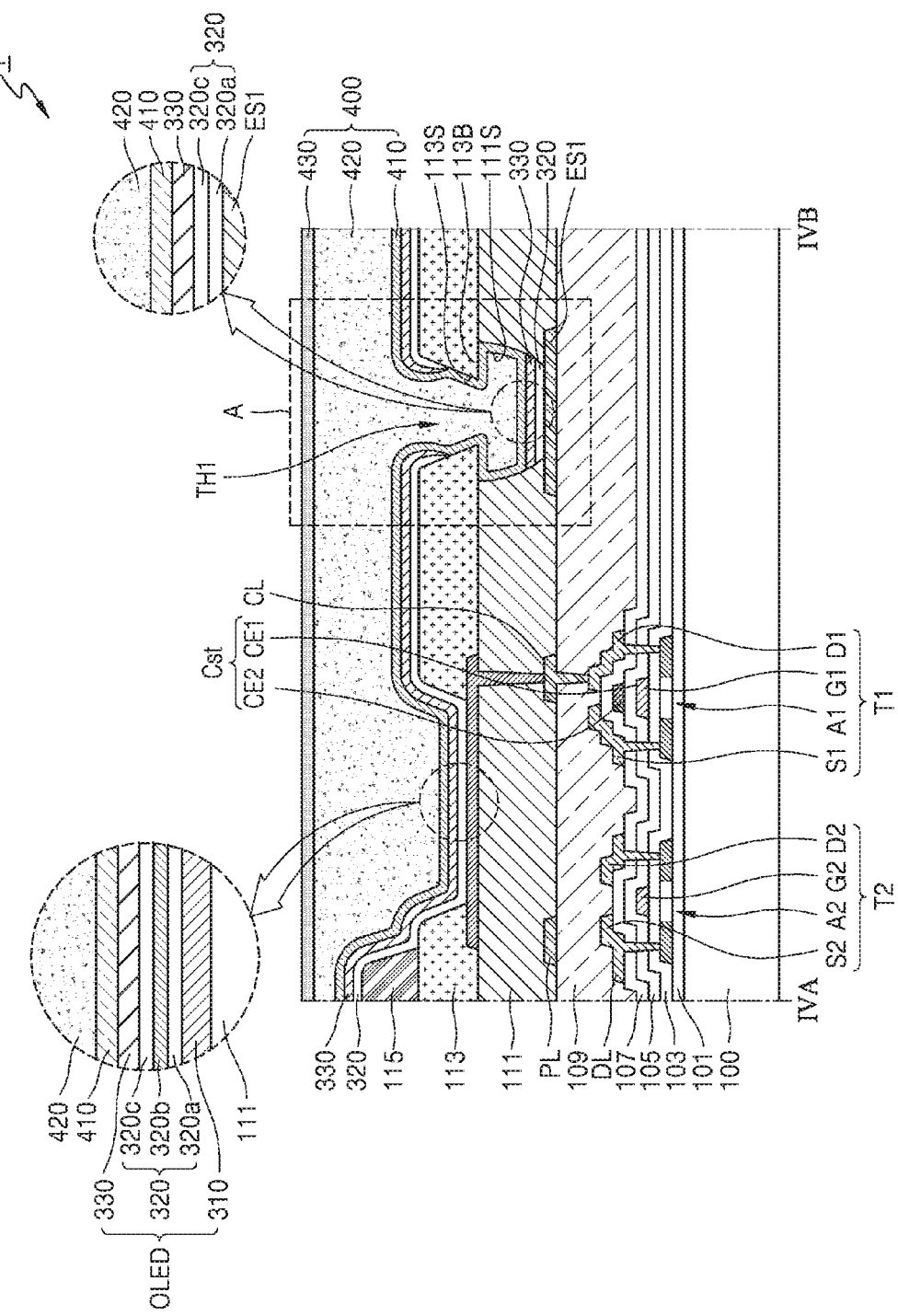
FIG. 4 is a cross-sectional view of the display apparatus of FIG. 3 taken along line IVA-IVB according to an exemplary embodiment.

FIG. 1 is a plan view schematically illustrating a display apparatus according to an exemplary embodiment, FIGS. 2A and 2B are equivalent circuit diagrams of one pixel in a display apparatus according to an exemplary embodiment, FIG. 3 is a plan view schematically illustrating region III of FIG. 1 according to an exemplary embodiment, and FIG. 4 is a cross-sectional view of the display apparatus of FIG. 3 taken along line IVA-IVB according to an exemplary embodiment.

Referring to FIG. 1, a display apparatus 1 includes a display area DA on a substrate 100. The display area DA includes a plurality of data lines DL that extend in a first direction, and pixels P connected to the plurality of data lines DL and to a plurality of scan lines SL that extend in a second direction crossing the first direction. Each of the pixels P may be connected to a driving voltage line PL that extends in the first direction.

One pixel P may emit red, green, blue or white light. In an example, one pixel P may include an organic light emitting diode (OLED). Also, each pixel P may further include a device such as, for example, a thin film transistor, a capacitor, etc.

The display area DA may provide a certain image through light emitted from the pixels P. A non-display area NDA is outside the display area DA. For example, the non-display area NDA may surround the display area DA.

The non-display area NDA, in which the pixels P are not arranged, does not provide an image. A first power supply voltage line 10 and a second power supply voltage line 20, which provides a different voltage from that of the first power supply voltage line 10, may be positioned in the non-display area NDA.

The first power supply voltage line 10 may include a first main voltage line 11 and a first connection line 12, which are positioned at one side of the display area DA. For example, when the display area DA has a rectangular shape, the first main voltage line 11 may be located to correspond to one side of the display area DA. The first connection line 12 may extend from the first main voltage line 11 in the first direction away from the display area DA. The first connection line 12 may be connected to a second terminal 32 of a terminal unit 30.

The second power supply voltage line 20 may include a second main voltage line 21 that partially surrounds both ends of the first main voltage line 11 and the display area DA, and a second connection line 22 that extends from the second main voltage line 21 in the first direction away from the display area DA. For example, when the display area DA has a rectangular shape, the second main voltage line 21 may extend along both ends of the first main voltage line 11 and sides of the display area DA excluding the one side adjacent to the first main voltage line 11. The second connection line 22 may extend in the first direction substantially parallel to the first connection line 12, and may be connected to a third terminal 33 of the terminal unit 30. The second power supply voltage line 20 may be bent so as to surround an end of the first power supply voltage line 10.

The terminal unit 30 may be positioned on an end of the substrate 100 and may include a plurality of terminals including a first terminal 31, a second terminal 32, and a third terminal 33. In an exemplary embodiment, the terminal unit 30 is not covered by an insulating layer. In this case, the terminal unit 30 may be exposed, and thus may be electrically connected to a controller such as, for example, a flexible printed circuit board or a driver integrated circuit (IC) chip.

The controller may change a plurality of image signals provided from the outside into a plurality of image data signals, and may provide the changed signals to the display area DA through a first terminal 31. Also, the controller may receive a vertical sync signal, a horizontal sync signal, and a clock signal, may generate a control signal for controlling the driving of each of first and second gate driving units, and may provide the generated control signal to each of the first and second gate driving units through a terminal.

The controller may provide different voltages to each of the first power supply voltage line 10 and the second power supply voltage line 20 through the second terminal 32 and the third terminal 33.

The first power supply voltage line 10 may provide a first power supply voltage (see ELVDD of FIGS. 2A and 2B) to each pixel P, and the second power supply voltage line 20 may provide a second power supply voltage (see ELVSS of FIGS. 2A and 2B) to each pixel P.

For example, the first power supply voltage ELVDD may be provided to each pixel P through the driving voltage line PL connected to the first power supply voltage line 10. The second power supply voltage ELVSS may be provided to a cathode of an organic light-emitting diode (see OLED of FIGS. 2A and 2B) in each pixel P. In this case, the second main voltage line 21 of the second power supply voltage line 20 may be in contact with the cathode of the organic light-emitting diode OLED in the non-display area NDA.

A scan driver for providing scan signals to the plurality of scan lines SL of each pixel P, and a data driver for providing data signals to the plurality of data lines DL, may be further positioned in the non-display area NDA.

A first dam part 110 that surrounds the display area DA, and a second dam part 120 spaced apart from the first dam part 110, may be disposed in the non-display area NDA.

The first dam part 110 and the second dam part 120 may function as a dam for preventing an organic material from flowing in a direction of edges of the substrate 100 when an organic encapsulation layer (see 420 of FIG. 4) including an organic material such as, for example, a monomer that constitutes a thin-film encapsulation layer (see 400 of FIG. 4), is formed using an ink jet process. Thus, the first dam part 110 and the second dam part 120 may prevent an edge tail from being formed by the organic encapsulation layer 420 at the edges of the substrate 100.

Referring to FIG. 2A, each pixel P may include a pixel circuit PC connected to the scan lines SL and the data lines DL, and an organic light-emitting diode OLED connected to the pixel circuit PC.

The pixel circuit PC may include a driving thin-film transistor T1, a switching thin-film transistor T2, and a storage capacitor Cst. The switching thin-film transistor T2 may be configured to deliver data signals Dm input through the data lines DL to the driving thin-film transistor T1 according to scan signals Sn input through the scan lines SL.

The storage capacitor Cst may be connected to the switching thin-film transistor T2, and the driving voltage line PL and may store a voltage that corresponds to a difference between a voltage transmitted from the switching thin-film transistor T2 and the first power supply voltage ELVDD (or a driving voltage) supplied to the driving voltage line PL.

The driving thin-film transistor T1 may be connected to the driving voltage line PL and the storage capacitor Cst, and may control a driving current that flows through the organic light-emitting diode OLED from the driving voltage line PL in correspondence with a voltage value stored in the storage capacitor Cst. The organic light-emitting diode OLED may emit light having a certain brightness due to the driving current.

In FIG. 2A, the pixel circuit PC includes two thin-film transistors and one storage capacitor. However, exemplary embodiments are not limited thereto.

Referring to FIG. 2B, the pixel circuit PC may include driving and switching thin-film transistors T1 and T2, a compensation thin-film transistor T3, a first initialization thin-film transistor T4, a first emission control thin-film transistor T5, a second emission control thin-film transistor T6, and a second initialization thin-film transistor T7.

In FIG. 2B, signal lines SLn (where n is a positive integer), SLn−1, EL, and DL, an initialization voltage line VL, and a driving voltage line PL are provided in each pixel P.

However, exemplary embodiments are not limited thereto. For example, in an exemplary embodiment, at least one of the signal lines SLn, SLn−1, EL, and DL and/or the initialization voltage line VL may be shared in adjacent pixels.

A drain electrode of the driving thin-film transistor T1 may be electrically connected to the organic light-emitting diode OLED via the second emission control thin-film transistor T6. The driving thin-film transistor T1 may receive the data signal Dm and supply the driving current to the organic light-emitting diode OLED according to a switching operation of the switching thin-film transistor T2.

A gate electrode of the switching thin-film transistor T2 may be connected to the first scan line SLn, and a source electrode of the switching thin-film transistor T2 may be connected to the data line DL. A drain electrode of the switching thin-film transistor T2 may be connected to a source electrode of the driving thin-film transistor T1, and may be connected to the driving voltage line PL via the first emission control thin-film transistor T5.

The switching thin-film transistor T2 may be turned on according to the first scan signal Sn provided through the first scan line SLn, and may perform a switching operation of providing the data signal Dm provided to the data line DL to the source electrode of the driving thin-film transistor T1.

A gate electrode of the compensation thin-film transistor T3 may be connected to the first scan line SLn. A source electrode of the compensation thin-film transistor T3 may be connected to the drain electrode of the driving thin-film transistor T1, and may be connected to a pixel electrode of the organic light-emitting diode OLED via the second emission control thin-film transistor T6. A drain electrode of the compensation thin-film transistor T3 may be connected together to one electrode of the storage capacitor Cst, a source electrode of the first initialization thin-film transistor T4, and a gate electrode of the driving thin-film transistor T1. The compensation thin-film transistor T3 may be turned on according to the first scan signal Sn provided through the first scan line SL, and may connect the gate electrode to the drain electrode of the driving thin-film transistor T1, thereby diode-connecting the driving thin-film transistor T1.

A gate electrode of the first initialization thin-film transistor T4 may be connected to a second scan line SLn−1 (a previous scan line). A drain electrode of the first initialization thin-film transistor T4 may be connected to the initialization voltage line VL. A source electrode of the first initialization thin-film transistor T4 may be connected together to one electrode of the storage capacitor Cst, the drain electrode of the compensation thin-film transistor T3, and the gate electrode of the driving thin-film transistor T1. The first initialization thin-film transistor T4 may be turned on according to the second scan signal Sn−1 provided through the second scan line SLn−1, and may perform an initialization operation of initializing a voltage of the gate electrode of the driving thin-film transistor T1 by providing an initialization voltage VINT to the gate electrode of the driving thin-film transistor T1.

A gate electrode of the first emission control thin-film transistor T5 may be connected to the emission control line EL. A source electrode of the first emission control thin-film transistor T5 may be connected to the driving voltage line PL. A drain electrode of the first emission control thin-film transistor T5 may be connected to the source electrode of the driving thin-film transistor T1 and the drain electrode of the switching thin-film transistor T2.

A gate electrode of the second emission control thin-film transistor T6 may be connected to the emission control line EL. A source electrode of the second emission control thin-film transistor T6 may be connected to the drain electrode of the driving thin-film transistor T1 and the source electrode of the compensation thin-film transistor T3. The drain electrode of the second emission control thin-film transistor T6 may be electrically connected to the pixel electrode of the organic light-emitting diode OLED. The first emission control thin-film transistor T5 and the second emission control thin-film transistor T6 may be turned on simultaneously according to the emission control signal En provided through the emission control line EL. Thus, the first power supply voltage ELVDD may be provided to the organic light-emitting diode OLED and the driving current may flow through the organic light-emitting diode OLED.

A gate electrode of the second initialization thin-film transistor T7 may be connected to the second scan line SLn−1. A source electrode of the second initialization thin-film transistor T7 may be connected to the pixel electrode of the organic light-emitting diode OLED. A drain electrode of the second initialization thin-film transistor T7 may be connected to the initialization voltage line VL. The second initialization thin-film transistor T7 may be turned on according to the second scan signal Sn−1 provided through the second scan line SLn−1, and thus may initialize the pixel electrode of the organic light-emitting diode OLED.

In FIG. 2B, the first initialization thin-film transistor T4 and the second initialization thin-film transistor T7 are connected to the second scan line SLn−1. However, exemplary embodiments are not limited thereto. For example, in an exemplary embodiment, the first initialization thin-film transistor T4 may be connected to the second scan line SLn−1 that is the previous scan line and may be driven according to the second scan line Sn−1, and the second initialization thin-film transistor T7 may be connected to an additional signal line, for example, a subsequent scan line, and may be driven according to a signal provided to the corresponding scan line.

One electrode of the storage capacitor Cst may be connected to the driving voltage line PL. Another electrode of the storage capacitor Cst may be connected together to the gate electrode of the driving thin-film transistor T1, the drain electrode of the compensation thin-film transistor T3, and the source electrode of the first initialization thin-film transistor T4.

An opposite electrode, for example, a cathode of the organic light-emitting diode OLED, may receive the second power supply voltage ELVSS (or a common power supply voltage). The organic light-emitting diode OLED may receive the driving current from the driving thin-film transistor T1, and thus may emit light.

It is to be understood that the pixel circuit PC is not limited to the number of thin-film transistors and storage capacitors and the circuit design described above with reference to FIGS. 2A and 2B. For example, according to exemplary embodiments, the number of thin-film transistors and storage capacitors and the circuit design may be variously modified.

Referring to FIG. 3, a plurality of pixels P are arranged in region III of FIG. 1. The plurality of pixels P may be surrounded by a pixel-defining layer 113, and spacers 115 may be arranged on the pixel-defining layer 113. A plurality of first holes TH1 that pass through the insulating layer may be formed between the pixels P.

In FIG. 3, each of the pixels P has a rectangular shape with the same size. However, exemplary embodiments are not limited thereto. For example, according to exemplary embodiments, the size, shape, and arrangement of the pixels P may be modified.

The spacers 115 may be arranged between part of the plurality of pixels P. For example, the spacers 115 may be arranged between some, but not all, of the plurality of pixels P, and may be arranged in a non-uniform manner. The spacers 115 may maintain separation between a mask and the substrate during a process of depositing an intermediate layer (see 320 of FIG. 4) including an emission layer using the mask, and thus, may prevent or reduce defects in which the intermediate layer 320 is stamped or torn by the mask during the deposition process.

The spacers 115 may include the same material as the pixel-defining layer 113. When the pixel-defining layer 113 is formed using a half-tone mask, the spacers 115 may be formed of the same material as the pixel-defining layer 113 to a different height from the pixel-defining layer 113.

The first holes TH1 may be formed between part of the plurality of pixels P. For example, the first holes TH1 may be formed between some, but not all, of the plurality of pixels P, and may be formed in a non-uniform manner. The first holes TH1 may be formed in the pixel-defining layer 113 and a second planarization layer 111 so as to have a certain opening space that penetrates the pixel-defining layer 113 and the second planarization layer 111, so that a thin-film encapsulation layer 400 that will be described below may be fixed to a back plane.

Referring to FIG. 4, a buffer layer 101 may be located on the substrate 100, and the driving thin-film transistor T1, the switching thin-film transistor T2, and the storage capacitor Cst may be located on the buffer layer 101.

The substrate 100 may include various materials such as, for example, glass, metal or plastic. For example, the substrate 100 may include a flexible substrate including polymer resin, such as polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

The buffer layer 101, which may include, for example, silicon oxide (SiOx) and/or silicon nitride (SiNx), may be formed on the substrate 100 so as to prevent or reduce penetration of impurities.

The driving thin-film transistor T1 may include a driving semiconductor layer A1 and a driving gate electrode G1, and the switching thin-film transistor T2 may include a switching semiconductor layer A2 and a switching gate electrode G2. A first gate insulating layer 103 is disposed between the driving semiconductor layer A1 and the driving gate electrode G1 and between the switching semiconductor layer A2 and the switching gate electrode G2. The first gate insulating layer 103 may include an inorganic insulating material such as, for example, silicon oxide (SiOx), silicon nitride (SiNx), or silicon oxynitride (SiON).

The driving semiconductor layer A1 and the switching semiconductor layer A2 may include, for example, amorphous silicon or polycrystalline silicon. In an exemplary embodiment, the driving semiconductor layer A1 and the switching semiconductor layer A2 may include an oxide including at least one of, for example, indium (In), gallium (Ga), tin (Sn), zirconium (Zr), vanadium (V), hafnium (Hf), cadmium (Cd), germanium Ge), chromium (Cr), titanium (Ti), and zinc (Zn).

The driving semiconductor layer A1 may include a driving channel region which overlaps the driving gate electrode G1 and in which no impurity is doped, and a driving source region and a driving drain region in which impurities are doped into both sides of the driving channel region. A driving source electrode S1 and a driving drain electrode D1 may be connected to the driving source region and the driving drain region, respectively.

The switching semiconductor layer A2 may include a switching channel region which overlaps the switching gate electrode G2 and in which no impurity is doped, and a switching source region and a switching drain region in which impurities are doped into both sides of the switching channel region. A switching source electrode S2 and a switching drain electrode D2 may be connected to the switching source region and the switching drain region, respectively.

The driving gate electrode G1 and the switching gate electrode G2 may include, for example, molybdenum (Mo), aluminum (Al), copper (Cu), and titanium (T1), and may have a single layer or multi-layer structure.

In exemplary embodiments, the storage capacitor Cst may overlap the driving thin-film transistor T1. In this case, the area of the storage capacitor Cst and the driving thin-film transistor T1 may be increased, and a high-quality image may be provided. For example, the driving gate electrode G1 may be a first storage capacitor CE1 of the storage capacitor Cst. A second storage capacitor CE2 may overlap the first storage capacitor CE1, with a second gate insulating layer 105 disposed between the first storage capacitor CE1 and the second storage capacitor CE2. The second gate insulating layer 105 may include an inorganic insulating material such as, for example, silicon oxide (SiOx), silicon nitride (SiNx), and silicon oxynitride (SiON).

The driving thin-film transistor T1, the switching thin-film transistor T2, and the storage capacitor Cst may be covered by an interlayer insulating layer 107.

The interlayer insulating layer 107 may include an inorganic material layer such as, for example, silicon oxynitride (SiON), silicon oxide (SiOx) and/or silicon nitride (SiNx).

The data lines DL may be positioned on the interlayer insulating layer 107, and the data lines DL may be in contact with the switching semiconductor layer A2 of the switching thin-film transistor T2 through a contact hole that penetrates into the interlayer insulating layer 107. The date lines DL may function as a switching source electrode S2.

The driving source electrode S1, the driving drain electrode D1, the switching source electrode S2, and the switching drain electrode D2 may be arranged on the interlayer insulating layer 107, and may be in contact with the driving semiconductor layer A1 or the switching semiconductor layer A2 through a contact hole that penetrates into the interlayer insulating layer 107.

In addition, the data line DL, the driving source electrode S1, the driving drain electrode D1, the switching source electrode S2, and the switching drain electrode D2 may be covered by an inorganic protective layer.

The inorganic protective layer may have a single layer or multi-layer structure of, for example, silicon nitride (SiNx) and silicon oxide (SiOx). The inorganic protective layer may prevent part of wires exposed in the non-display area NDA, for example, wires formed together in the same process as the data lines DL, from being damaged by an etchant used when a pixel electrode 310 is patterned.

The driving voltage line PL may be located on a different layer from that of the data lines DL. Herein, when a component A and a component B are described as being located on different layers, it may mean that at least one insulating layer is disposed between component A and component B (e.g., one of component A and component B is located under at least one insulating layer, and the other one of component A and component B is located above the at least one insulating layer). A first planarization layer 109 may be disposed between the driving voltage line PL and the data lines DL, and the driving voltage line PL may be covered by the second planarization layer 111.

The driving voltage line PL may have a single layer or multi-layer structure including at least one of, for example, aluminum (Al), copper (Cu), titanium (T1), and an alloy thereof. In an exemplary embodiment, the driving voltage line PL may have a three-layer structure of Ti/Al/Ti.

FIG. 4 illustrates a configuration in which the driving voltage line PL is located on the first planarization layer 109. However, exemplary embodiments are not limited thereto. For example, in an exemplary embodiment, the driving voltage line PL may be in contact with a lower additional voltage line formed on the same layer as the data lines DL through a through hole formed in the first planarization layer 109.

The first planarization layer 109 and the second planarization layer 111 may have a single layer or multi-layer structure.

The first planarization layer 109 and the second planarization layer 111 may include organic insulating materials. In an example, the organic insulating materials may include a general-purpose polymer such as polymethyl methacrylate (PMMA) or polystyrene (PS), a polymer derivative having a phenol-based group, acryl-based polymer, aryl ether-based polymer, amide-based polymer, fluorine-based polymer, p-xylene-based polymer, and vinyl alcohol-based polymer.

Also, the first planarization layer 109 and the second planarization layer 111 may include inorganic insulating materials. In an exemplary embodiment, the inorganic insulating materials may include, for example, silicon oxynitride (SiON), silicon oxide (SiOx), and silicon nitride (SiNx).

An organic light-emitting diode OLED may be located on the second planarization layer 111. The organic light-emitting diode OLED may include a pixel electrode 310, an opposite electrode 330, and an intermediate layer 320 disposed between the pixel electrode 310 and the opposite electrode 330 and including an emission layer 320b.

The pixel electrode 310 may be connected to a connection line CL formed on the first planarization layer 109, and the connection line CL may be connected to the driving drain electrode D1 of the driving thin-film transistor T1.

The pixel electrode 310 may include a transparent electrode or reflective electrode.

When the pixel electrode 310 includes a transparent electrode, the pixel electrode 310 may include a transparent conductive layer. The transparent conductive layer may include at least one of, for example, indium tin oxide (ITO), indium zinc oxide (IZO), zinc oxide (ZnO), indium oxide ($In_2O_3$), indium gallium oxide (IGO), and aluminum zinc oxide (AZO). In this case, the pixel electrode 310 may further include a semi-transparent layer, which may improve light efficiency in addition to the transparent conductive layer. The semi-transparent layer may include at least one of, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and ytterbium (Yb), which are formed as a thin film having a thickness of several to several tens of micrometers (um).

When the pixel electrode 310 includes a reflective electrode, the pixel electrode 310 may include a reflective layer including at least one of, for example, Ag, Mg, Al, Pt, Pd, Au, Ni, Nd, Ir, Cr, and a compound thereof, and a transparent conductive layer, which is on and/or under the reflective layer. The transparent conductive layer may include at least one of, for example, ITO, IZO, ZnO, $In_2O_3$, IGO, and AZO.

However, exemplary embodiments are not limited thereto, and the pixel electrode 310 may include various materials. In addition, various modifications in which the structure of the pixel electrode 310 has a single layer or multi-layer structure may be made according to exemplary embodiments.

The pixel-defining layer 113 may be located on the pixel electrode 310. As shown in FIG. 4, the pixel-defining layer 113 may cover at least one edge of the pixel electrode 310. For example, as shown in FIG. 4, the pixel-defining layer may cover a first edge of the pixel electrode 310, and may cover a second edge of the pixel electrode 310 opposing the first edge. Thus, the pixel-defining layer 113 may cover at least one edge of the pixel electrode 310 of each of the plurality of pixels P.

The pixel-defining layer 113 may have an opening that exposes the pixel electrode 310, thereby defining the pixels P. Also, the pixel-defining layer 113 may increase a distance between ends of the pixel electrode 310 and the opposite electrode 330, thereby preventing an arc from occurring therebetween. The pixel-defining layer 113 may include an organic material such as, for example, polyimide or hexamethyldisiloxane (HMDSO).

The intermediate layer 320 may include the emission layer 320b, a first functional layer 320a disposed under the emission layer 320b, and/or a second functional layer 320c disposed on the emission layer 320b. The emission layer 320b may include a polymer or small molecular weight organic material that emits light having a certain color.

The first functional layer 320a may have a single layer or multi-layer structure. For example, when the first functional layer 320a includes a polymer material, the first functional layer 320a may include a hole transport layer (HTL) having a single layer structure and may include poly-(3,4)-ethylenedihydroxy thiophene (PEDOT) or polyaniline (PANI). When the first functional layer 320a includes a small molecular weight material, the first functional layer 320a may include a hole injection layer (HIL) and a hole transport layer (HTL).

In exemplary embodiments, the second functional layer 320c is not included in the intermediate layer 320. For example, when the first functional layer 320a and the emission layer 320b include small molecular weight materials, the second functional layer 320c may be formed. The second functional layer 320c may have a single layer or multi-layer structure. The second functional layer 320c may include an electron transport layer (ETL) and/or an electron injection layer (EIL).

The emission layer 320b of the intermediate layer 320 may be located in each of the pixels P in the display area DA. The emission layer 320b may be formed above the pixel electrode 310 exposed through the opening of the pixel-defining layer 113. The first and second functional layers 320a and 320c of the intermediate layer 320 may be formed as an integral layer on the plurality of pixel electrodes 310. The intermediate layer 320 may be formed using various methods such as, for example, vacuum deposition.

The opposite electrode 330 may be located at an upper portion of the display area DA so as to cover the display area DA. For example, the opposite electrode 330 may be formed integrally in a plurality of organic light-emitting diodes OLED and may correspond to the plurality of pixel electrodes 310. The opposite electrode 330 may be electrically connected to a second power supply voltage line 20 that will be described below.

The opposite electrode 330 may include a transparent electrode or reflective electrode. When the opposite electrode 330 includes a transparent electrode, the opposite electrode 330 may include at least one of, for example, Ag, Al, Mg, Li, Ca, Cu, LiF/Ca, LiF/Al, MgAg, and CaAg, and may have a shape of a thin film having a thickness of several to several tens of micrometers (um).

When the opposite electrode 330 includes a reflective electrode, the opposite electrode 330 may include at least one of, for example, Ag, Al, Mg, Li, Ca, Cu, LiF/Ca, LiF/Al, MgAg, and CaAg. However, the configuration and material of the opposite electrode 330 are not limited thereto, and may be modified according to exemplary embodiments.

The spacers 115 may be arranged on the pixel-defining layer 113. The spacers 115 may protrude from the pixel-defining layer 113 in a direction of a thin-film encapsulation layer 400, and may maintain separation between the mask and the substrate 100 in a process of depositing the intermediate layer 320 including the emission layer, thereby preventing defects in which the intermediate layer 320 is stamped or torn by the mask during the deposition process.

The spacers 115 may include an organic material such as, for example, polyimide or HMDSO. The spacers 115 may be arranged on at least one of the first through third dam parts 110, 120, and 130 that will be described later, and thus may be used to prevent or reduce moisture movement and to form a step height of the dam parts.

The thin-film encapsulation layer 400 may cover and protect the organic light-emitting diode OLED from being damaged by, for example, moisture or oxygen.

The thin-film encapsulation layer 400 may cover the display area DA and may extend to the outside of the display area DA. The thin-film encapsulation layer 400 may include at least one organic encapsulation layer and at least one inorganic encapsulation layer. In an exemplary embodiment, the thin-film encapsulation layer 400 may include a first inorganic encapsulation layer 410, an organic encapsulation layer 420, and a second inorganic encapsulation layer 430.

The first inorganic encapsulation layer 410 may cover the opposite electrode 330 and may include, for example, silicon oxide, silicon nitride, and/or silicon oxynitride.

Additional layers such as, for example, a capping layer may be disposed between the first inorganic encapsulation layer 410 and the opposite electrode 330. The capping layer may include, for example, at least one organic or inorganic material of silicon oxide ($SiO_2$), silicon nitride ($SiN_x$), zinc oxide ($ZnO_2$), titanium oxide ($TiO_2$), zirconium oxide ($ZrO_2$), indium tin oxide (ITO), indium zinc oxide (IZO), $Alq_3$, CuPc, CBP, a-NPB, and $ZiO_2$ so as to improve light efficiency. In an exemplary embodiment, the capping layer may cause a plasma resonance phenomenon with respect to light generated in the organic light-emitting diode OLED. For example, the capping layer may include nanoparticles. In addition, the capping layer may prevent the organic light-emitting diode OLED from being damaged by heat and plasma generated in a chemical vapor deposition (CVD) process for forming the thin-film encapsulation layer 400 or a sputtering process. For example, the capping layer may include an epoxy-based material formed of at least one of a bisphenol type epoxy resin, epoxidized butadiene resin, a fluorine type epoxy resin, and a novolac epoxy resin.

Also, a layer including LiF may be disposed between the first inorganic encapsulation layer 410 and the capping layer.

The first inorganic encapsulation layer 410 is formed along a lower structure thereof, and thus, a top surface of the first inorganic encapsulation layer 410 is not substantially flat. The organic encapsulation layer 420 may cover and planarize the first inorganic encapsulation layer 410. A top surface of the organic encapsulation layer 420 that corresponds to the display area DA may be substantially flat (e.g., exactly flat, or approximately flat within a measurement error).

The organic encapsulation layer 420 may include, for example, at least one of polyethylene terephthalate, polyethylene naphthalate, polycarbonate, polyimide, polyethylene sulfonate, polyoxymethylene, polyarylate, hexamethyldisiloxane, acryl-based resin (for example, polymethylmethacrylate, polyacrylic acid), or a combination thereof.

The second inorganic encapsulation layer 430 may cover the organic encapsulation layer 420 and may include, for example, silicon oxide, silicon nitride and/or silicon oxynitride. The second inorganic encapsulation layer 430 may be deposited so as to be in direct contact with the first inorganic encapsulation layer 410 on ends of the display apparatus 1, so that the organic encapsulation layer 420 may be sealed such that it is not exposed to the outside of the display apparatus 1.

However, defects, in which the thin-film encapsulation layer 400 peels off from the back plane of the display apparatus 1, may occur in a subsequent process after the thin-film encapsulation layer 400 is formed. This subsequent process may be, for example, when a touch sensor layer is formed on the thin-film encapsulation layer 400 or an external force is applied to the thin-film encapsulation layer 400 during a process of removing a protective film adhered onto the thin-film encapsulation layer 400 before a polarization film is attached. The back plane may be a structure of the display apparatus 1 immediately before the thin-film encapsulation layer 400 is formed.

For example, when the opposite electrode 330 is formed immediately before the thin-film encapsulation layer 400 is formed, peeling defects may occur between the display apparatus 1 including the opposite electrode 330 and the thin-film encapsulation layer 400. For example, when the capping layer described above is formed between the opposite electrode 330 and the thin-film encapsulation layer 400 immediately before the thin-film encapsulation layer 400 is formed, peeling defects may occur between the display apparatus 1 including the capping layer and the thin-film encapsulation layer 400. For example, when a layer including LiF is formed on the capping layer and the first inorganic encapsulation layer 410, peeling defects may occur between the display apparatus 1 including the layer including LiF and the thin-film encapsulation layer 400. In addition, when another functional layer is further added between the opposite electrode 330 and the thin-film encapsulation layer 400 immediately before the thin-film encapsulation layer 400 is formed, the display apparatus 1 including the organic light-emitting diode OLED and the functional layer may be understood as a back plane.

In exemplary embodiments, to reduce peeling defects of the thin-film encapsulation layer 400, a plurality of first holes TH1 that function as an anchor with respect to the thin-film encapsulation layer 400 may be formed between the plurality of pixels P in the display area DA. The plurality of first holes TH1 may increase the adhesive strength of the thin-film encapsulation layer 400 and the back plane, thus preventing the defects described above from occurring.

The plurality of first holes TH1 may be spaced apart from the pixel electrode 310, may pass through the second planarization layer 111 and the pixel-defining layer 113, and may be formed to have a certain opening space.

A first etching prevention layer ES1 is located on the first planarization layer 109 at a position where the first holes TH1 are formed. For example, the location of the first etching prevention layer ES1 may correspond to the location of the first holes TH1. The first etching prevention layer ES1 may be spaced apart from the connection line CL, may include the same material as the connection line CL, and may be formed in the same process as the connection line CL. The first etching prevention layer ES1 may be configured to prevent or reduce deterioration of the first planarization layer 109 and a variety of wires, electrodes, and circuits of the display apparatus 1 thereunder during a process of forming the first holes TH1, for example, when the opening space of the first holes TH1 is formed by dry etching.

The intermediate layer 320 and the opposite electrode 330 may be formed on bottom surfaces of the first holes TH1. For example, the intermediate layer 320 and the opposite electrode 300 may be formed between the first holes TH1 and the first etching prevention layer ES1. In an exemplary embodiment, the first functional layer 320a and the second functional layer 320c of the intermediate layer 320 are formed inside the first holes TH1 (as well as outside the first holes TH1), and the emission layer 320b of the intermediate layer 320 is not formed inside the first holes TH1. This is because the emission layer 320b is deposited only in an emission area patterned in each pixel P using the patterned metal mask, and the first functional layer 320a and the second functional layer 320b are not patterned in each pixel P, but rather, may be deposited on all of the pixels P as a common layer. The opposite electrode 330 may be deposited on all of the pixels as a common layer, in a similar manner as the first and second functional layers 320a and 320c.

The first inorganic encapsulation layer 410 of the thin-film encapsulation layer 400 is formed on the opposite electrode 330 inside the first holes TH1. The first inorganic encapsulation layer 410 is not formed only on the bottom surfaces of the first holes TH1, but is entirely formed on the inner surfaces of the first holes TH1 including a side surface 111S of the second planarization layer 111, a side surface 113S of the pixel-defining layer 113, and a bottom surface 113B of the pixel-defining layer 113. For example, the first inorganic encapsulation layer 410 may be conformally formed along an entirety of the inner surface of the first holes TH1, such that there are no breaks or gaps present in the first inorganic encapsulation layer 410 within the first holes TH1.

The first inorganic encapsulation layer 410 is in direct contact with the opposite electrode 330 on the bottom surfaces inside the first holes TH1, is in direct contact with the second planarization layer 111 on the side surface 111S of the second planarization layer 111, and is in direct contact with the pixel-defining layer 113 on the bottom surface 113B and the side surface 113S of the pixel-defining layer 113. As a result, the contact area between the first inorganic encapsulation layer 410 and organic insulating layers may be increased, and thus, adhesion of the thin-film encapsulation layer 400 may be improved.

The organic encapsulation layer 420 fills the whole inside of the first holes TH1. For example, the organic encapsulation layer 420 fills an entirety of the first holes TH1. For example, in an exemplary embodiment, the shape of the opening formed in the first holes TH1 is an undercut shape in which the side surface 113S of the pixel-defining layer 113 protrudes further into the first holes TH1 than the side surface 111S of the second planarization layer 111 at a boundary surface where the pixel-defining layer 113 and the second planarization layer 111 meet with each other. Thus, the undercut-shaped opening is filled by the organic encapsulation layer 420 so that the first holes TH1 may function as an anchor which increases adhesive strength between the thin-film encapsulation layer 400 and the back plane. For example, in an exemplary embodiment, a width of the portion of the organic encapsulation layer 420 disposed in the first holes TH1 in an area below the pixel-defining layer 113 (e.g., in an area within the second planarization layer 111) is greater than a width of the portion of the organic encapsulation layer 420 disposed in the first holes TH1 in an area above the second planarization layer 111 (e.g., in an area within the pixel-defining layer 113), thus forming an anchor structure increasing adhesive strength between the thin-film encapsulation layer 400 and the back plane.

As described above, in the display apparatus 1 according to an exemplary embodiment, the plurality of first holes TH1 are formed between the plurality of pixels P in the display area DA. As a result, the adhesive strength between the thin-film encapsulation layer 400 and the back plane may be increased, and thus, defects in which the thin-film encapsulation layer 400 peels off from the back plane may be reduced.

Hereinafter, a manufacturing process of forming the first holes TH1 of FIG. 4 according to an exemplary embodiment will be described with reference to FIGS. 5A through 5H.

FIGS. 5A through 5H are cross-sectional views schematically illustrating a manufacturing process of forming a first hole TH1 in region A of FIG. 4 according to an exemplary embodiment.

Figure 5A:
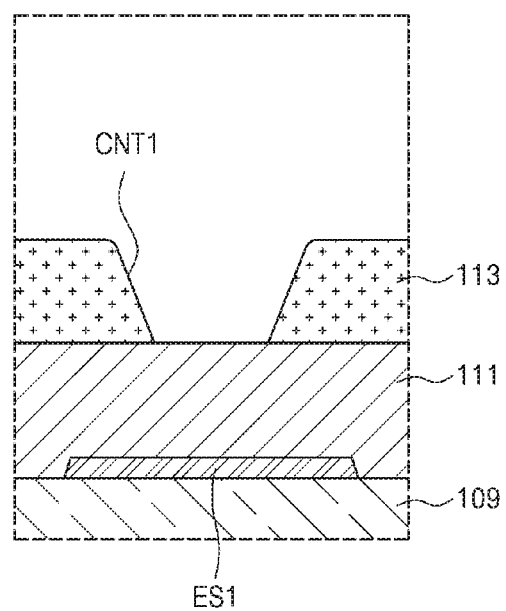
FIG. 5A through FIG. 5H are cross-sectional views schematically illustrating a manufacturing process of forming a first hole in area A of FIG. 4 according to an exemplary embodiment.

Referring to FIG. 5A, the first etching prevention layer ES1 may be formed on the first planarization layer 109, and the second planarization layer 111 may be formed on the first etching prevention layer ES1. The pixel-defining layer 113 having a first contact hole CNT1 formed therein may be formed on the second planarization layer 111.

Figure 5B:
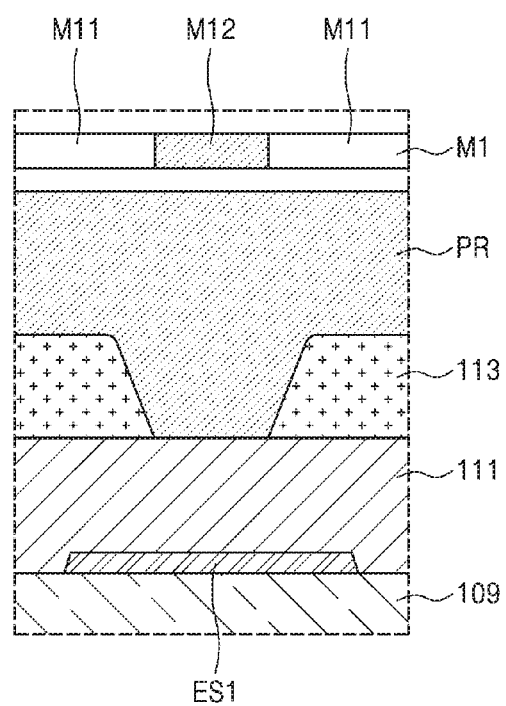

Referring to FIG. 5B, a photoresist PR may be formed on the second planarization layer 111 and the pixel-defining layer 113, and a photolithography process may be performed using a first mask M1 having a light-transmitting portion M11 in which light is transmitted therethrough, and a light-shielding portion M12 in which light is not transmitted therethrough.

Figure 5C:
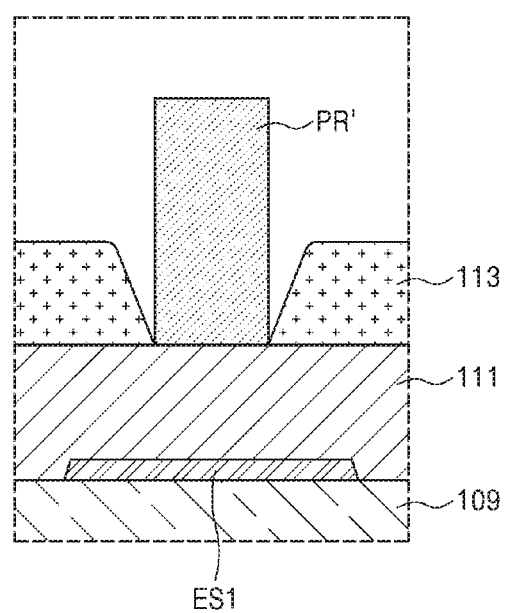

Referring to FIG. 5C, the photoresist PR may be developed so that part of a photoresist pattern PR' may remain.

Figure 5D:
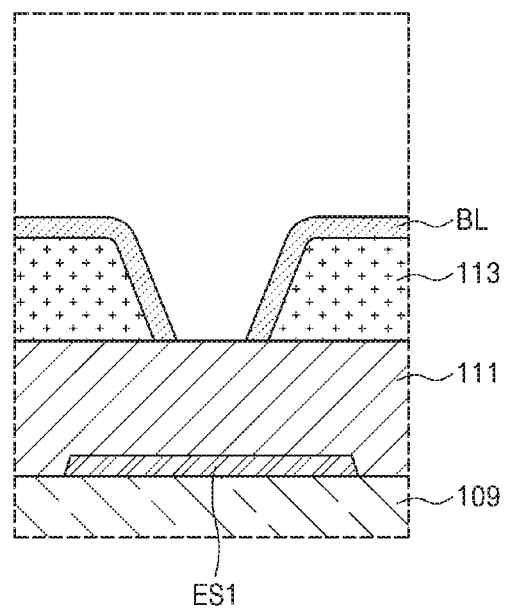

Referring to FIG. 5D, a barrier layer BL may be formed using a deposition process, and the remaining photoresist pattern PR' may be removed.

Figure 5E:
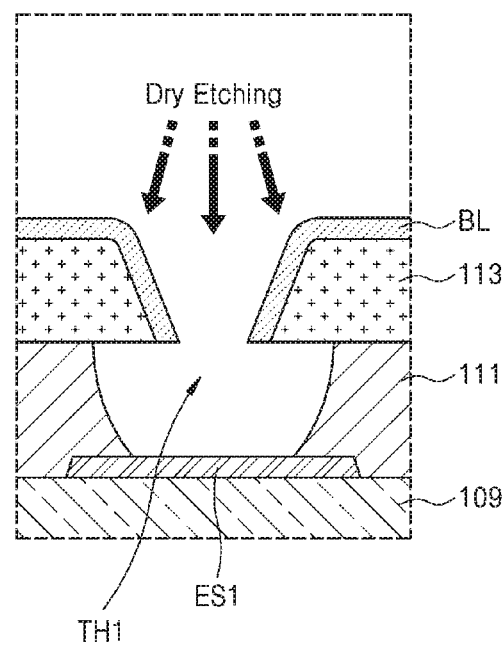

Referring to FIG. 5E, the pixel-defining layer 113 and the second planarization layer 111 may be etched using the barrier layer BL as an etching mask, thereby forming the first hole TH1. The first hole TH1 may be formed by, for example, dry etching.

Figure 5F:
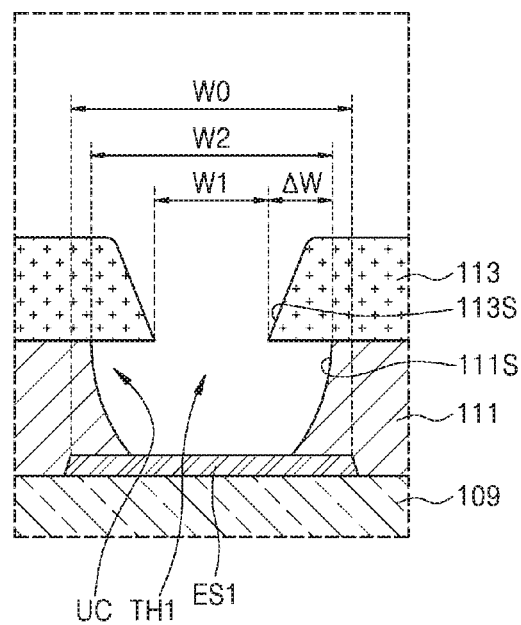

Referring to FIG. 5F, the barrier layer BL may be removed by, for example, wet etching, and the first hole TH1 may then be formed. The shape of the opening formed in the first hole TH1 may be a shape of an undercut UC in which the side surface 113S of the pixel-defining layer 113 protrudes into the first hole TH1 more than the side surface 111S of the second planarization layer 111 at a boundary surface where the pixel-defining layer 113 and the second planarization layer 111 meet with each other. A first width W1 of the opening formed in the pixel-defining layer 113 may be less than a second width W2 of the opening formed in the second planarization layer 111 based on the boundary surface between the pixel-defining layer 113 and the second planarization layer 111. For example, ends of the pixel-defining layer 113 may protrude further into the first hole TH1 than ends of the second planarization layer 111 by ΔW at the boundary surface, and thus, the undercut UC may be formed on the bottom surface of the pixel-defining layer 113.

A width W0 of the first etching prevention layer ES1 may be greater than the first width W1 and the second width W2. Thus, the first planarization layer 109 and a variety of wires, electrodes, and circuits of the display apparatus 1 disposed under the first planarization layer 109 may be prevented from being deteriorated by dry etching.

Figure 5G:
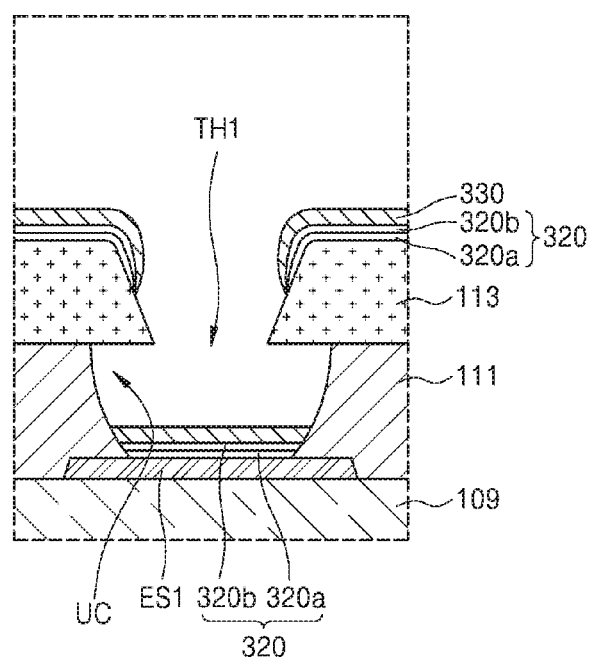

Referring to FIG. 5G, the intermediate layer 320 and the opposite electrode 330 may be deposited into the first hole TH1. The intermediate layer 320 and the opposite electrode 330 may be formed on a bottom surface of the first hole TH1 and a top surface of the pixel-defining layer 113. For example, the intermediate layer 320 and the opposite electrode 330 may be cut based on the undercut UC of the first hole TH1. The intermediate layer 320 formed in the first hole TH1 may include the first functional layer 320a and the second functional layer 320c, and does not include the emission layer 320b.

The intermediate layer 320 and the opposite electrode 330 may be formed through, for example, physical vapor deposition (PVD). In an example, the intermediate layer 320 and the opposite electrode 330 may be formed using one process of, for example, sputtering, thermal evaporation, E-beam evaporation, laser molecular beam epitaxy, and pulsed laser deposition.

Figure 5H:
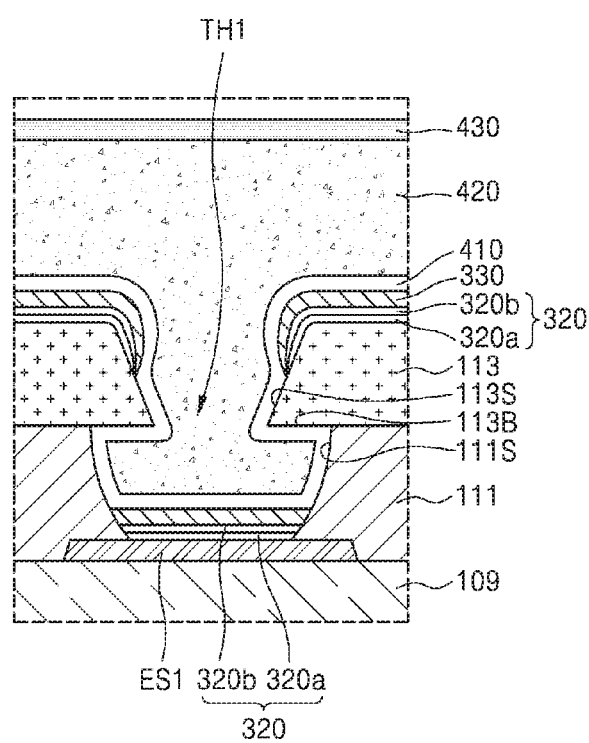

Referring to FIG. 5H, the thin-film encapsulation layer 400 including the first inorganic encapsulation layer 410, the organic encapsulation layer 420, and the second inorganic encapsulation layer 430 may be formed in the first hole TH1.

The first inorganic encapsulation layer 410 is not formed only on the bottom surface of the first hole TH1, but rather, may be formed on the entirety of the inner surface of the first hole TH1 including the side surface 111S of the second planarization layer 111, the side surface 113S of the pixel-defining layer 113, and the bottom surface 113B of the pixel-defining layer 113.

The first inorganic encapsulation layer 410 may be formed through, for example, CVD or atomic layer deposition (ALD) having a higher step coverage compared to PVD. In an example, the first inorganic encapsulation layer 410 may be formed using one process of, for example, thermal CVD, plasma CVD, metal-organic CVD (MOCVD), and hydride vapor phase epitaxy (HVPE).

After the first inorganic encapsulation layer 410 is formed, the organic encapsulation layer 420 is formed. The entirety of the inside of the first hole TH1 may be filled by the organic encapsulation layer 420. After the organic encapsulation layer 420 is formed, the second inorganic encapsulation layer 430 may be formed.

Figure 6:
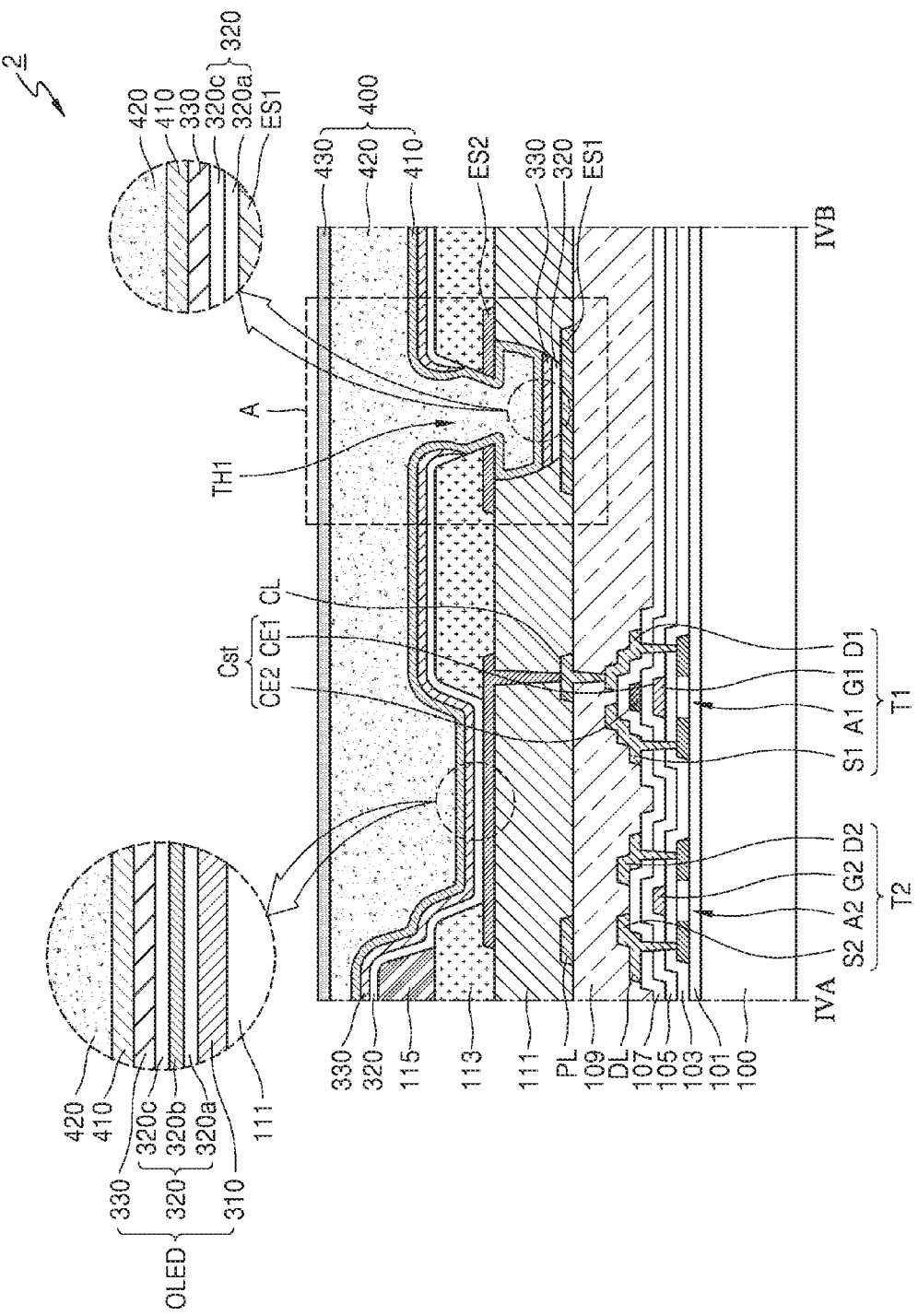
FIG. 6 is a cross-sectional view schematically illustrating part of a display apparatus according to an embodiment.

FIG. 6 is a cross-sectional view schematically illustrating part of a display apparatus 2 according to an exemplary embodiment. For example, FIG. 6 corresponds to a cross-sectional view of the display apparatus of FIG. 3 taken along line IVA-IVB according to an exemplary embodiment.

For convenience of explanation, the following description will focus primarily on differences between the exemplary embodiment of FIG. 4 described above and the exemplary embodiment of FIG. 6, and a further description of elements and aspects previously described may be omitted.

Referring to FIG. 6, a second etching prevention layer ES2 may be positioned between the second planarization layer 111 and the pixel-defining layer 113. The second etching prevention layer ES2 may be spaced apart from the pixel electrode 310. The second etching prevention layer ES2 may include the same material as the pixel electrode 310.

When dry etching is performed to form the opening of the first hole TH1, due to process dispersion of dry etching, the pixel-defining layer 113 may be over-etched. However, in an exemplary embodiment, the second etching prevention layer ES2 may be positioned between the pixel-defining layer 113 and the second planarization layer 111, and may prevent over-etching of the pixel-defining layer 113, allowing for efficient formation of the undercut shape of the first hole TH1.

As described above, the undercut shape of the first hole TH1 may be efficiently formed, and thus, the first inorganic encapsulation layer 410 may be formed on the entirety of the inner surface of the first hole TH1. Thus, a contact area in which the first inorganic encapsulation layer 410 is in contact with organic insulating layers such as, for example, the pixel-defining layer 113 and the second planarization layer 111, may be increased, and adhesion of the thin-film encapsulation layer 400 may be improved. Also, the entirety of the first hole TH1 having the undercut shape is filled by the organic encapsulation layer 420, thereby increasing the adhesive strength between the thin-film encapsulation layer 400 and the back plane.

Figure 7:
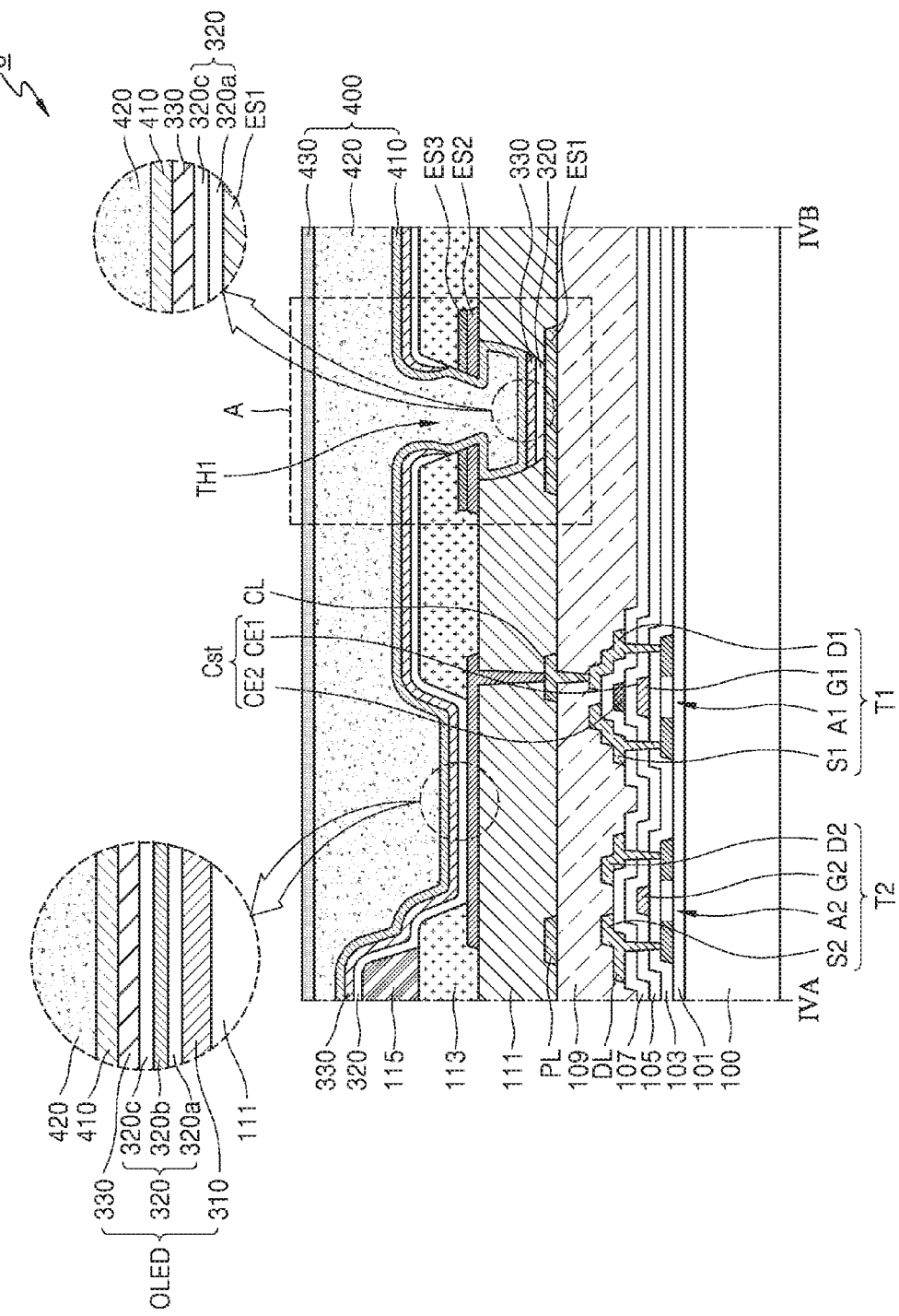
FIG. 7 is a cross-sectional view schematically illustrating part of a display apparatus according to an exemplary embodiment.

FIG. 7 is a cross-sectional view schematically illustrating part of a display apparatus 3 according to an exemplary embodiment. For example, FIG. 7 corresponds to a cross-sectional view of the display apparatus of FIG. 3 taken along line IVA-IVB according to an exemplary embodiment.

For convenience of explanation, the following description will focus primarily on differences between the exemplary embodiment of FIG. 6 described above and the exemplary embodiment of FIG. 7, and a further description of elements and aspects previously described may be omitted.

Referring to FIG. 7, the second etching prevention layer ES2 may be positioned between the second planarization layer 111 and the pixel-defining layer 113, and a third etching prevention layer ES3 may be further positioned on the second etching prevention layer ES2. The third etching prevention layer ES3 may include, for example, metal, an inorganic layer, or an oxide layer.

Even though the second etching prevention layer ES2 is included in the exemplary embodiment of FIG. 7, the pixel-defining layer 113 may be etched while dry etching is performed to form the opening of the first hole TH1, and thus, an undercut having a desired shape may not be attained. However, in an exemplary embodiment, the third etching prevention layer ES3 may be further formed on the second etching prevention layer ES2. Thus, the pixel-defining layer 113 may be prevented from being etched so that an undercut having a desired shape may be formed.

Figure 8:
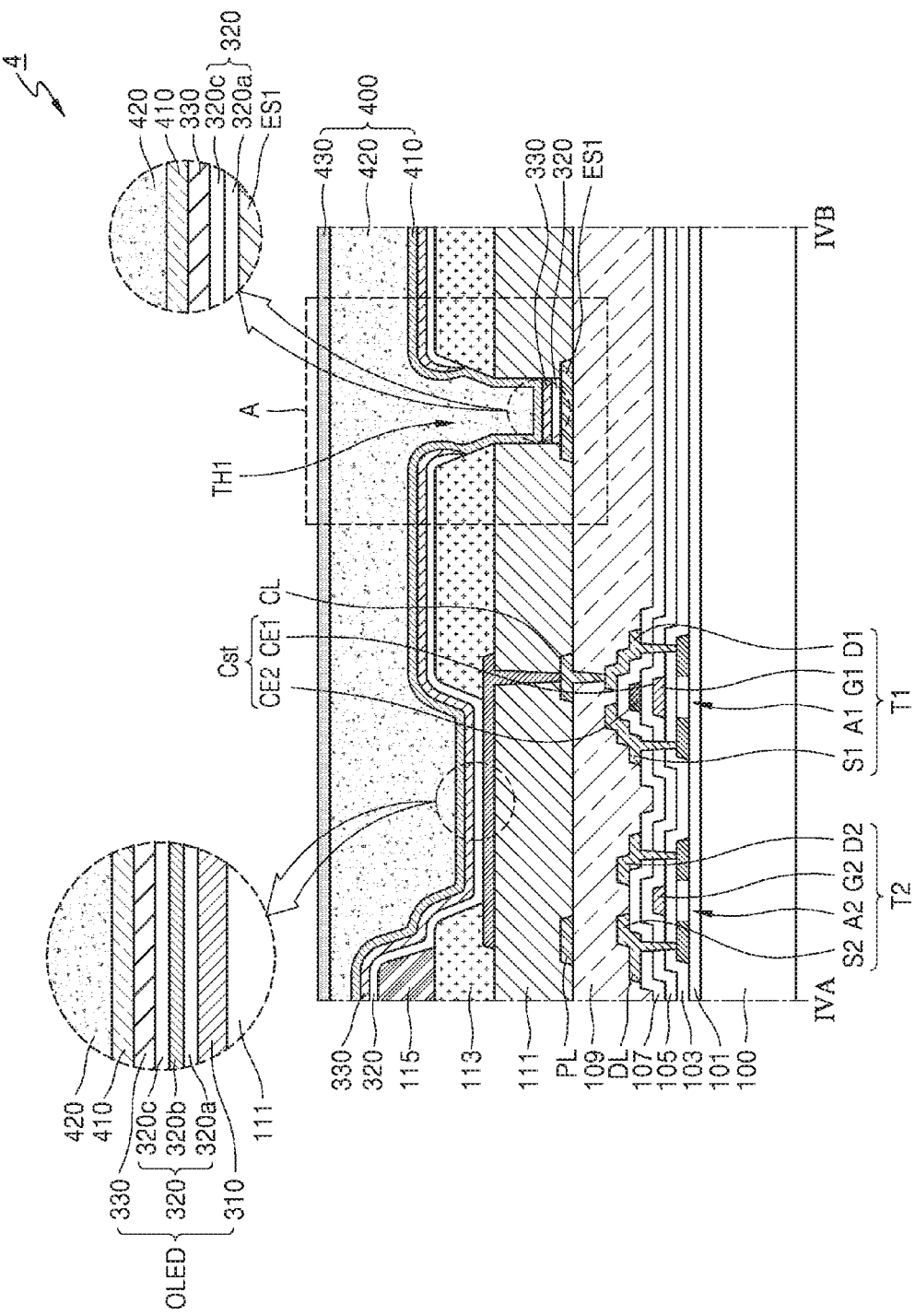
FIG. 8 is a cross-sectional view schematically illustrating part of a display apparatus according to an exemplary embodiment.

FIG. 8 is a cross-sectional view schematically illustrating part of a display apparatus 4 according to an exemplary embodiment. For example, FIG. 8 corresponds to a cross-sectional view of the display apparatus of FIG. 3 taken along line IVA-IVB according to an exemplary embodiment.

For convenience of explanation, the following description will focus primarily on differences between the exemplary embodiment of FIG. 4 described above and the exemplary embodiment of FIG. 8, and a further description of elements and aspects previously described may be omitted.

Referring to FIG. 8, the shape of the first hole TH1 is not an undercut shape. For example, a width of an opening formed in the pixel-defining layer 113 and a width of an opening formed in the second planarization layer 111 may be about equal to each other based on a boundary surface between the pixel-defining layer 113 and the second planarization layer 111.

Although the first hole TH1 in the exemplary embodiment of FIG. 8 does not have an undercut shape, the first inorganic encapsulation layer 410 is formed on the entirety of the inside of the first hole TH1 so that the contact area between the first inorganic encapsulation layer 410 and organic insulating layers such as, for example, the pixel-defining layer 113 and the second planarization layer 111, may be increased, and thus, adhesion of the thin-film encapsulation layer 400 may be improved. Also, the entirety of the inside of the first hole TH1 may be filled by the organic encapsulation layer 420, and thus, the adhesive strength between the thin-film encapsulation layer 400 and the back plane may be increased.

FIGS. 9A through 9E are cross-sectional views schematically illustrating the manufacturing process of forming the first hole TH1 of FIG. 8 according to an exemplary embodiment.

Figure 9A:
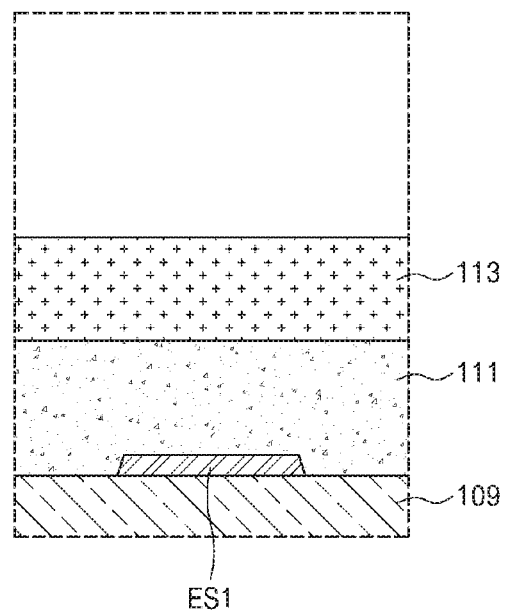
FIGS. 9A through 9E are cross-sectional views schematically illustrating the manufacturing process of forming the first hole of FIG. 8 according to an exemplary embodiment.

Referring to FIG. 9A, the first etching prevention layer ES1 may be formed on the first planarization layer 109, and the second planarization layer 111 may be formed on the first etching prevention layer ES1. The pixel-defining layer 113 is formed on the second planarization layer 111. Compared to FIG. 5A, the first contact hole CNT1 is not formed in the pixel-defining layer 113 at this point in the manufacturing process.

Figure 9B:
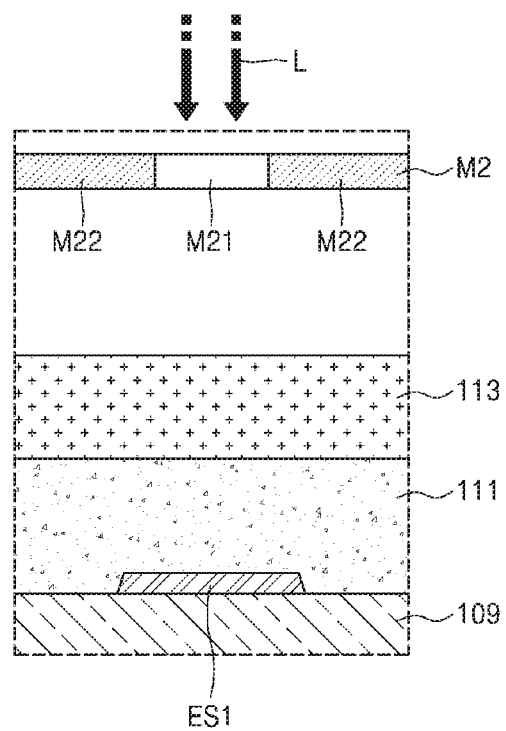

Referring to FIG. 9B, a second mask M2 including a light-transmitting portion M21 in which light is transmitted therethrough, and a light-shielding portion M22 in which light is not transmitted through, may be formed on the pixel-defining layer 113, and the second mask M2 may be irradiated with a laser L.

Figure 9C:
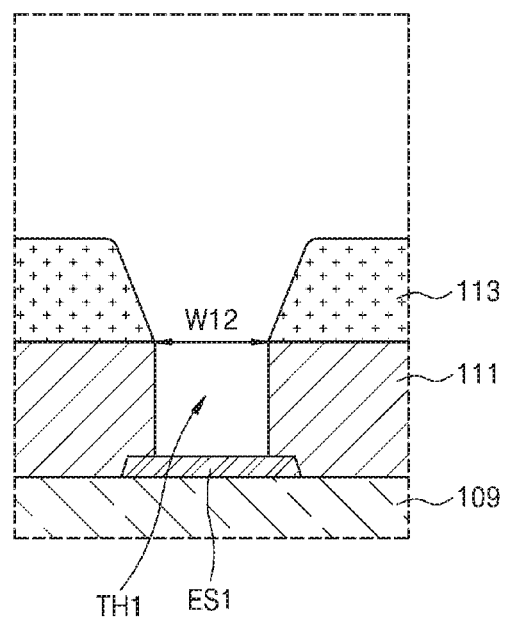

Referring to FIG. 9C, the first hole TH1 may be formed after the location corresponding to the first hole TH1 is irradiated with the laser L. The shape of the opening formed in the first hole TH1 is not the undercut shape. For example, a width W12 of an opening formed in the pixel-defining layer 113 and a width W12 of an opening formed in the second planarization layer 111 may be about equal to each other based on a boundary surface between the pixel-defining layer 113 and the second planarization layer 111.

Figure 9D:
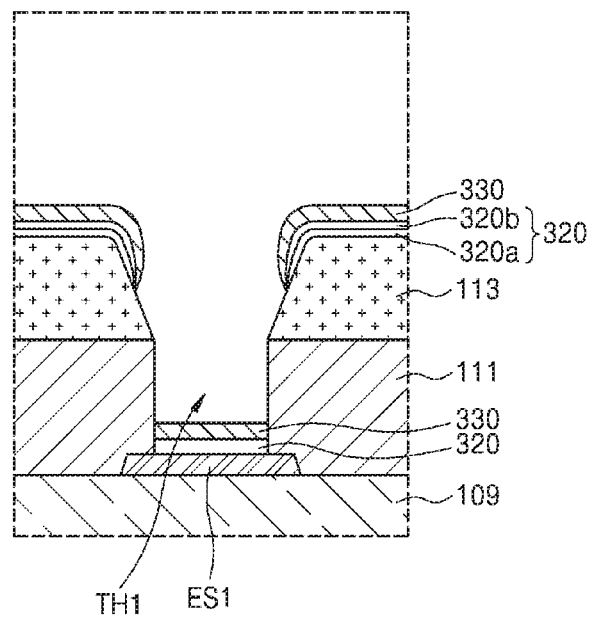

Referring to FIG. 9D, the intermediate layer 320 and the opposite electrode 330 may be deposited into the first hole TH1. The intermediate layer 320 and the opposite electrode 330 may be formed on the bottom surface of the first hole TH1 and the top surface of the pixel-defining layer 113. The intermediate layer 320 formed in the first hole TH1 may include the first functional layer 320a and the second functional layer 320c, and does not include the emission layer 320b.

Because the intermediate layer 320 and the opposite electrode 330 may be formed using PVD having a lower step coverage than in CVD, the intermediate layer 320 and the opposite electrode 330 are not deposited on the inner surface of the first hole TH1 in an exemplary embodiment.

Figure 9E:
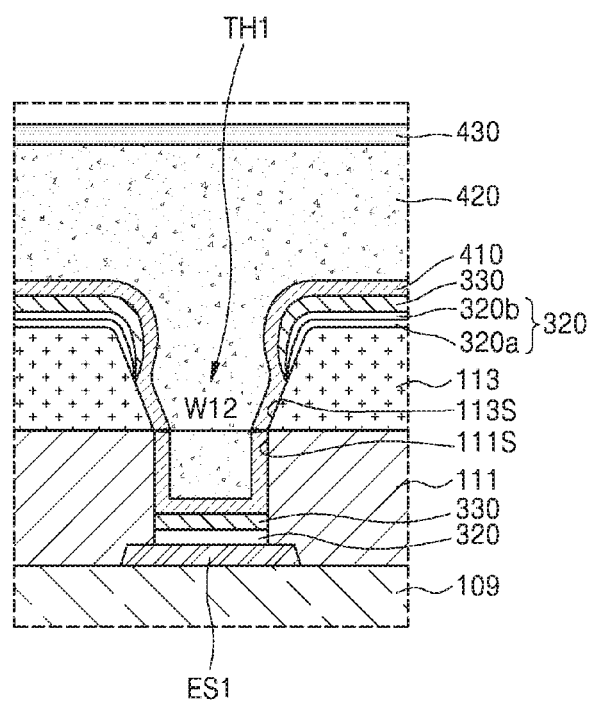

Referring to FIG. 9E, the thin-film encapsulation layer 400 including the first inorganic encapsulation layer 410, the organic encapsulation layer 420, and the second inorganic encapsulation layer 430 may be formed in the first hole TH1.

The first inorganic encapsulation layer 410 is not formed only on the bottom surface of the first hole TH1, but rather, may be formed on the entirety of the inner surface of the first hole TH1 including the side surface 111S of the second planarization layer 111 and the side surface 113S of the pixel-defining layer 113. The first inorganic encapsulation layer 410 may be formed using CVD having a higher step coverage than in PVD.

After the first inorganic encapsulation layer 410 is formed, the organic encapsulation layer 420 is formed. The entirety of the inside of the first hole TH1 may be filled by the organic encapsulation layer 420. After the organic encapsulation layer 420 is formed, the second inorganic encapsulation layer 430 is formed.

In FIGS. 5A through 5E, the first etching prevention layer ES1 is shown. However, exemplary embodiments are not limited thereto. For example, because the irradiation depth of the laser beam may be adjusted by adjusting the power of laser, even when the first etching prevention layer ES1 is removed, the first planarization layer 109 and elements under the first planarization layer 109 may be prevented from being deteriorated. Also, the first etching prevention layer ES1 may be removed to prevent increased reflectance caused by the first etching prevention layer ES1 in exemplary embodiments.

Also, in FIG. 9B, a laser irradiation area may be designated using the second mask M2 including the light-transmitting portion M21 and the light-shielding portion M22. However, exemplary embodiments are not limited thereto. For example, various means for transmitting/shielding laser irradiation in addition to the second mask M2 may be used according to exemplary embodiments.

A process of forming the first hole TH1 of FIG. 8 using the laser L is shown in FIGS. 9A through 9E. However, exemplary embodiments are not limited thereto. For example, in an exemplary embodiment, the first hole TH1 of FIG. 8 may be formed using a different process including, for example, a photolithography process.

Figure 10:
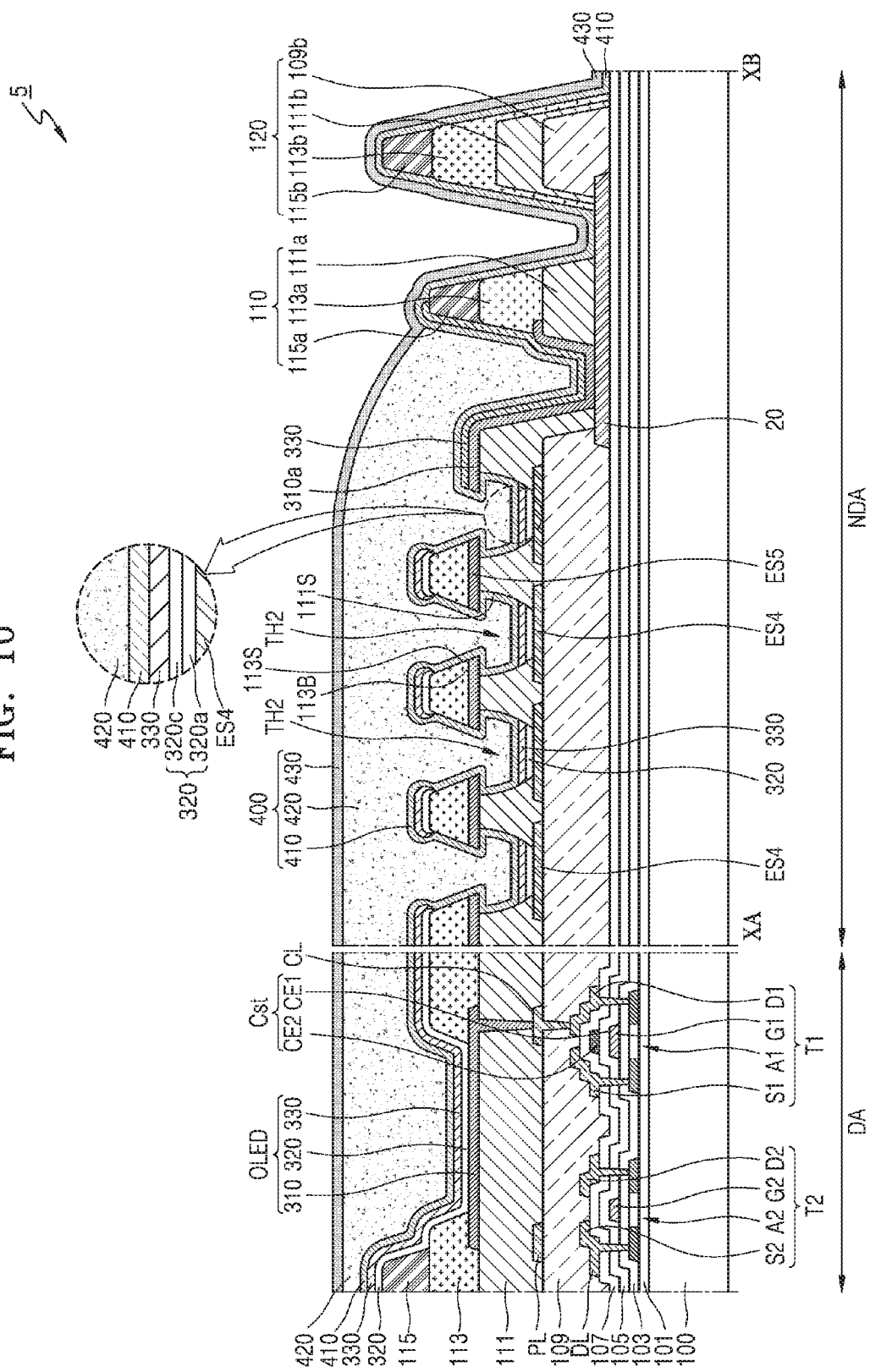
FIG. 10 is a cross-sectional view of the display apparatus of FIG. 1 taken along line XA-XB according to an exemplary embodiment.

Hereinafter, a display apparatus 5 according to an exemplary embodiment will be described with reference to FIG. 10. FIG. 10 is a cross-sectional view of the display apparatus of FIG. 1 taken along line XA-XB according to an exemplary embodiment.

Referring to FIG. 10, in an exemplary embodiment, a plurality of second holes TH2 may be formed in the non-display area NDA, and a first dam part 110 and a second dam part 120 may be positioned outside the second holes TH2. Similar to the exemplary embodiment of FIG. 4, the first holes TH1 may be formed in the display area DA in the exemplary embodiment of FIG. 10.

The first planarization layer 109, the second planarization layer 111, and the pixel-defining layer 113, which extend from the display area DA, may extend into the non-display area NDA such that they are disposed in the non-display area NDA as well as the display area DA.

A plurality of fourth etching prevention layers ES4 may be positioned on the first planarization layer 109, and a fifth etching prevention layer ES5 may be positioned between the second planarization layer 111 and the pixel-defining layer 113. A plurality of second holes TH2 that pass through the pixel-defining layer 113 and the second planarization layer 111 may be positioned on the fourth etching prevention layer ES4.

The fourth etching prevention layer ES4 may include the same material as the first etching prevention layer ES1 and/or the connection line CL of FIG. 4, and may be formed in the same process as the first etching prevention layer ES1 and/or the connection line CL of FIG. 4. During a process of forming the second holes TH2 (e.g., when an opening space of the second holes TH2 is formed by, for example, dry etching), the fourth etching prevention layer ES4 may prevent deterioration of the first planarization layer 109 and various wires, electrodes, and circuits of the display apparatus 5 thereunder.

The fifth etching prevention layer ES5 may include the same material as the pixel electrode 310. When dry etching is performed to form the opening of the second hole TH2, due to process dispersion of dry etching, the pixel-defining layer 113 may be over-etched. However, in an exemplary embodiment, the fifth etching prevention layer ES5 disposed between the pixel-defining layer 113 and the second planarization layer 111 may prevent over-etching of the pixel-defining layer 113, thereby allowing for efficient formation of the undercut shape of the second hole TH2.

In an exemplary embodiment, the intermediate layer 320 and the opposite electrode 330 are not formed only in the display area DA, but rather, may also extend into and be formed in part of the non-display area NDA outside the display area DA.

The intermediate layer 320 may be formed on the bottom surface of the second hole TH2 above the fifth etching prevention layer ES5. In an exemplary embodiment, the first functional layer 320a and the second functional layer 320c of the intermediate layer 320 may be formed inside the second hole TH2, and the emission layer 320b of the intermediate layer 320 is not formed inside the second hole TH2.

The opposite electrode 330 may be formed above the intermediate layer 320. Similar to the intermediate layer 320, in an exemplary embodiment, the opposite electrode 330 may be formed on the bottom surface of the second hole TH2 and is not formed on side surfaces of the second hole TH2.

The opposite electrode 330 may be deposited as a common layer on the entirety of the pixels P, similar to the first and second functional layer 320a and 320c. The opposite electrode 330 may be formed on the bottom surface of the inside of the second hole TH2, and may also be formed on a top surface of an outside of the second hole TH2.

Because the opposite electrode 330 may be integrally connected outside of the opening in which the second holes TH2 are formed, when viewed from a plane substantially parallel to the substrate 100, the opposite electrode 330 that extends from the display area DA may be electrically connected to the second power supply voltage line 20 described above.

The arrangement relationship in the plan view of the fifth etching prevention layer ES5, the pixel-defining layer 113, and the opposite electrode 330 will be described based on a region in which the second holes TH2 are formed, with reference to FIGS. 11A through 11D. FIGS. 11A through 11D are plan views schematically illustrating part of a process of forming the second holes TH2 of FIG. 10 according to an exemplary embodiment.

Figure 11A:
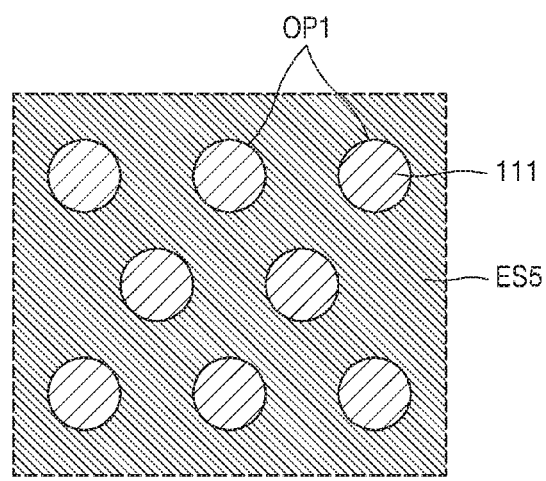
FIGS. 11A through 11D are plan views schematically illustrating part of a process of forming a second hole of FIG. 10 according to an exemplary embodiment.

Referring to FIG. 11A, the fifth etching prevention layer ES5 having a plurality of openings OP1 may be formed on the second planarization layer 111. The openings OP1 may be formed using a patterning process such as, for example, a photolithography process. The fifth etching prevention layer ES5 may be connected in a space outside the openings OP1. In this case, in an exemplary embodiment, the second planarization layer 111 inside the openings OP1 is not removed, and the second planarization layer 111 may be located inside the openings OP1.

Figure 11B:
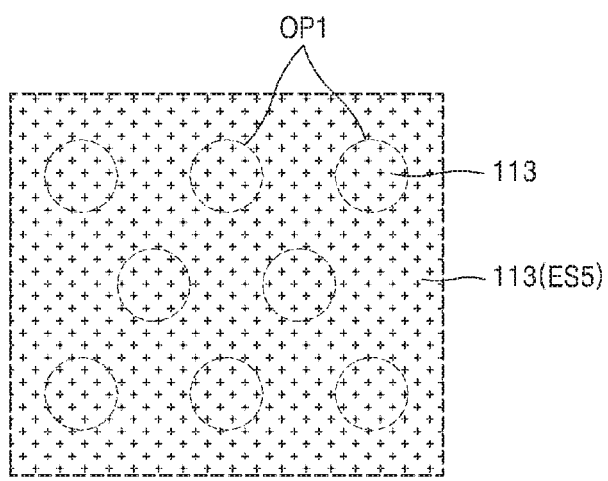

Referring to FIG. 11B, the pixel-defining layer 113 may be formed on the openings OP1 and the fifth etching prevention layer ES5.

Figure 11C:
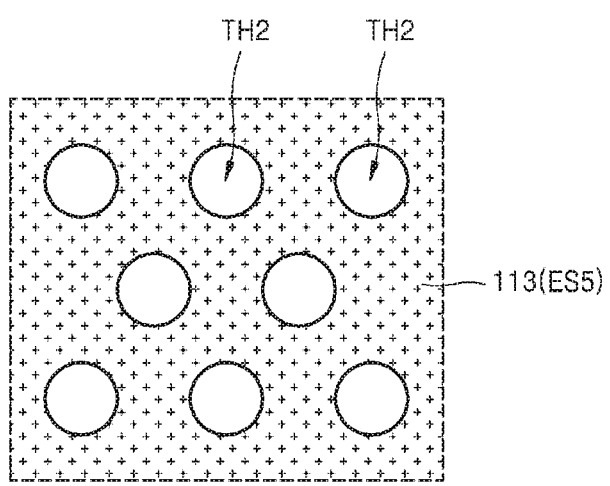

Referring to FIG. 11C, the second planarization layer 111 and the pixel-defining layer 113 may be dry etched so that the second holes TH2 may be formed.

The fifth etching prevention layer ES5 may prevent the pixel-defining layer 113 from being excessively etched, allowing the second holes TH2 having the undercut shape to be efficiently formed. In this case, the second planarization layer 111 disposed inside the second holes TH2 may be removed, and the pixel-defining layer 113 may be stacked on the fifth etching prevention layer ES5 outside the second holes TH2.

Although a plurality of first holes TH1 as described with reference to FIG. 3 may be formed in the display area DA, additionally arranging the first holes TH1 in a non-emission region between the pixels P may cause space restrictions as resolution increases. However, to account for this, the second holes TH2 may be formed in the non-display area NDA in an exemplary embodiment. Because a variety of wires, electrodes, and circuits of a display apparatus may be arranged in the non-display area NDA under the second holes TH2, a greater number of second holes TH2 per unit area than the number of first holes TH1 may be densely formed without space restrictions caused by resolution.

Although FIG. 11C illustrates that the shape of the second holes TH2 is a circular shape, exemplary embodiments are not limited thereto. For example, the shape and arrangement of the second openings TH2 may be variously modified.

Figure 11D:
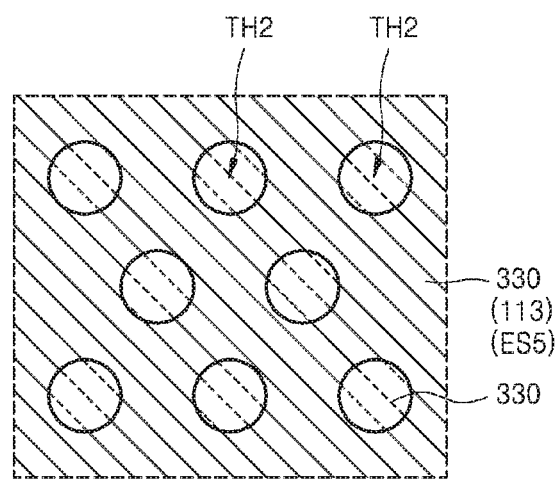

Referring to FIG. 11D, after the second holes TH2 are formed, the intermediate layer 320 and the opposite electrode 330 are sequentially deposited. FIG. 11D illustrates the opposite electrode 330 while the intermediate layer 320 is omitted. The opposite electrode 330 may cover the entirety of the intermediate layer 320 and may be formed in a wider region than the intermediate layer 320. After the intermediate layer 320 is formed, the opposite electrode 330 may be formed on the bottom surface inside the second hole TH2, and may also be formed on a top surface outside the second hole TH2.

Because the opposite electrode 330 is integrally connected outside the opening in which the second holes TH2 are formed, when viewed from a plane substantially parallel to the substrate 100, the opposite electrode 330 that extends from the display area DA may be electrically connected to the second power supply voltage line 20 described above.

Referring back to FIG. 10, the opposite electrode 330 may be connected to the second power supply voltage line 20 via a pixel electrode connection line 310a disposed between the second holes TH2 and the first dam part 110. The pixel electrode connection line 310a may be a line that extends from the fifth etching prevention layer ES5 described above. The pixel electrode connection line 310a may include the same material as the pixel electrode 310.

The first inorganic encapsulation layer 410 may be formed on the opposite electrode 330. The first inorganic encapsulation layer 410 is not formed only on a bottom surface of the second holes TH2, but rather, may be formed on an entirety of the inner surfaces of the second holes TH2 including the side surface 111S of the second planarization layer 111, the side surface 113S of the pixel-defining layer 113, and the bottom surface 113B of the pixel-defining layer 113.

The first inorganic encapsulation layer 410 is in direct contact with the opposite electrode 330 on the bottom surface inside the second holes TH2, in direct contact with the second planarization layer 111 on the side surface 111S of the second planarization layer 111, and in direct contact with the pixel-defining layer 113 on the bottom surface 113B of the pixel-defining layer 113 and the side surface 111S of the second planarization layer 111. As a result, adhesion of the thin-film encapsulation layer 400 may be improved by an increase in the contact area between the first inorganic encapsulation layer 410 and the organic insulating layers.

The entirety of the inside of the second hole TH2 may be filled by the organic encapsulation layer 420. Because the shape of the opening formed in the second hole TH2 is the shape of an undercut in which the side surface 113S of the pixel-defining layer 113 protrudes further into the second hole TH2 than the side surface 111S of the second planarization layer 111 at a boundary surface where the pixel-defining layer 113 and the second planarization layer 111 meet with each other, the undercut-shaped opening is filled by the organic encapsulation layer 420 so that the second hole TH2 may function as an anchor which increases adhesive strength between the thin-film encapsulation layer 400 and the back plane.

Outside the second holes TH2, the first dam part 110 and the second dam part 120 may be positioned at a location in which they overlap the second power supply voltage line 20.

The first dam part 110 may be formed with a first layer 111a including the same material as the second planarization layer 111, a second layer 113a including the same material as the pixel-defining layer 113, and a third layer 115a including the same material as the spacers 115. However, layers that constitute the first dam part 110 are not limited thereto, and the number and material of the layers may be modified.

Part of the first dam part 110 may overlap the opposite electrode 330 that extends in the display area DA. Ends of the opposite electrode 330 may extend to the second power supply voltage line 20. As a result, noise that may otherwise affect a touch sensor layer formed on the thin-film encapsulation layer 400 may be prevented or reduced.

The second dam part 120 may be formed with a first layer 109b including the same material as the first planarization layer 109, a second layer 111b including the same material as the second planarization layer 111, a third layer 113b including the same material as the pixel-defining layer 113, and a fourth layer 115b including the same material as the spacers 115. However, layers that constitute the second dam part 120 are not limited thereto, and the number and material of the layers may be modified.

The second dam part 120 may be formed higher than the first dam part 110. For example, the height of the second dam part 120 may be greater than that of the first dam part 110 with relation to the substrate. As a result, the organic encapsulation layer 420 may be prevented from forming an edge tail by climbing over the second dam part 120, and separation between the mask and the substrate 100 may be maintained during a process of depositing the intermediate layer 320 using the mask, and thus, defects in which the intermediate layer 320 may be stamped or torn by the mask, may be prevented or reduced in the deposition process.

The first layer 109b of the second dam part 120 may clad the ends of the second power supply voltage line 20, thereby preventing the second power supply voltage line 20 from being deteriorated during wet etching. For example, the first layer 109b of the second dam part 120 may cover the ends of the second power supply voltage line 20.

The first inorganic encapsulation layer 410 and the second inorganic encapsulation layer 430 may pass through the display area DA and a region, in which the second holes TH2 are formed, may cover the first dam part 110 and the second dam part 120 and may extend to the vicinity of the edges of the substrate 100. Outside the second dam part 120, the first inorganic encapsulation layer 410 and the second inorganic encapsulation layer 430 may be in direct contact with each other so that external moisture or impurities may be prevented from penetrating into the display apparatus 5 through the organic encapsulation layer 420.

In addition, the second holes TH2 formed in the non-display area NDA in an exemplary embodiment may be configured to improve adhesive strength between the thin-film encapsulation layer 400 and the back plane, as described above, thereby preventing peeling of the thin-film encapsulation layer 400. Also, because an opening space is formed in a direction substantially perpendicular to the substrate 100 to the heights of the second planarization layer 111 and the pixel-defining layer 113, the reflow velocity of an organic insulating material with fluidity may be reduced in a process of forming the organic encapsulation layer 420 using the organic material with fluidity.

The height of the second dam part 120 may be greater than that of the first dam part 110 so that the organic encapsulation layer 420 may be prevented from forming an edge tail at the edges of the substrate 100 by climbing over the second dam part 120. However, when a distance between the first dam part 110 and the second dam part 120 is reduced so as to reduce the width of a dead space, it may be difficult to control the reflow velocity of the organic encapsulation layer 420, and thus, the organic encapsulation layer 420 may climb over the second dam part 120.

The second holes TH2 according to an exemplary embodiment, which are a plurality of opening spaces formed between the display area DA and the first dam part 110, may reduce the reflow velocity of an organic insulating material that flows in a direction of the edges of the substrate 100 so that the organic insulating material may be sufficiently hardened before reaching the second dam part 120 so that formation of the edge tail caused by the organic insulating material may be prevented.

According to exemplary embodiments, a plurality of holes may be formed in a display area and/or a non-display area so that adhesive strength between a thin-film encapsulation layer and a back plane may be improved, and peeling of the thin-film encapsulation layer may be prevented.

While the present disclosure has been particularly shown and described with reference to the exemplary embodiments thereof, it will be understood by those of ordinary skill in the art that various changes in form and detail may be made therein without departing from the spirit and scope of the present disclosure as defined by the following claims.

What is claimed is:

1. A display apparatus, comprising:
   a substrate;
   a display area disposed on the substrate and comprising a plurality of pixels;
   a first planarization layer disposed on the substrate;
   a second planarization layer disposed on the first planarization layer;
   a pixel-defining layer disposed on the second planarization layer and covering at least one edge of a first electrode of each of the plurality of pixels;
   a plurality of first holes disposed between the plurality of pixels and spaced apart from the first electrode,
   wherein each of the first holes comprises an opening that passes through the second planarization layer and the pixel-defining layer; and
   a first etching prevention layer disposed on a bottom surface of each of the first holes and on the first planarization layer.

2. The display apparatus of claim 1, wherein
   a first width of the opening formed in the pixel-defining layer is less than a second width of the opening formed in the second planarization layer at a boundary surface between the pixel-defining layer and the second planarization layer.

3. The display apparatus of claim 2, further comprising:
   a second etching prevention layer disposed between the second planarization layer and the pixel-defining layer.

4. The display apparatus of claim 3, further comprising:
   a third etching prevention layer disposed on the second etching prevention layer.

5. The display apparatus of claim 1, wherein
each of the pixels comprises an intermediate layer disposed on the first electrode, and a second electrode disposed on the intermediate layer, and
the intermediate layer comprises an emission layer, and the intermediate layer and the second electrode are disposed inside each of the first holes.

6. The display apparatus of claim 5, wherein
the emission layer is disposed on the first electrode and is not disposed inside each of the first holes.

7. The display apparatus of claim 5, further comprising:
a thin-film encapsulation layer encapsulating the plurality of pixels, wherein
the thin-film encapsulation layer comprises a first inorganic encapsulation layer, a second inorganic encapsulation layer, and an organic encapsulation layer disposed between the first inorganic encapsulation layer and the second inorganic encapsulation layer,
the first inorganic encapsulation layer covers an entirety of the second electrode inside each of the first holes and inner surfaces of each of the first holes, and
an entirety of each of the first holes is filled by the organic encapsulation layer.

8. The display apparatus of claim 7, further comprising:
a thin-film transistor disposed between the substrate and the first planarization layer; and
a connection line disposed between the first planarization layer and the second planarization layer, and connecting the thin-film transistor to the first electrode, wherein
the connection line comprises a same material as the first etching prevention layer.

9. The display apparatus of claim 7, further comprising:
a plurality of second holes that pass through the second planarization layer and the pixel-defining layer in a non-display area disposed outside the display area; and
a second etching prevention layer disposed on a bottom surface of each of the second holes and the first planarization layer,
wherein the first planarization layer, the second planarization layer, and the pixel-defining layer extend into the non-display area.

10. The display apparatus of claim 9, wherein
the intermediate layer and the second electrode extend into the non-display area, and
the intermediate layer and the second electrode are disposed inside each of the second holes.

11. The display apparatus of claim 10, wherein
the first inorganic encapsulation layer, the organic encapsulation layer, and the second inorganic encapsulation layer extend into the non-display area,
the first inorganic encapsulation layer covers an entirety of the second electrode inside each of the second holes and inner surfaces of each of the second holes, and
an entirety of each of the second holes is filled by the organic encapsulation layer.

12. The display apparatus of claim 10, further comprising:
a power supply voltage line disposed in the non-display area and surrounding a part of the display area,
wherein the second electrode that extends into the non-display area is electrically connected to the power supply voltage line.

13. The display apparatus of claim 12, further comprising:
a first dam part and a second dam part disposed outside the display area, wherein the first dam part and the second dam part each comprise layers including a same material as the second planarization layer and the pixel-defining layer, and
the second dam part clads ends of the power supply voltage line.

14. The display apparatus of claim 1, further comprising:
a second etching prevention layer disposed between the second planarization layer and the pixel-defining layer.

15. The display apparatus of claim 1, wherein
a first width of the opening formed in the pixel-defining layer and a second width of the opening formed in the second planarization layer are about equal to each other at a boundary surface between the pixel-defining layer and the second planarization layer.

16. A display apparatus, comprising:
a substrate;
a display area disposed on the substrate and comprising a plurality of pixels,
wherein each of the plurality of pixels comprises a first electrode, a second electrode, and an intermediate layer disposed between the first electrode and the second electrode,
wherein the intermediate layer comprises an emission layer;
a thin-film encapsulation layer encapsulating the plurality of pixels, and comprising a first inorganic encapsulation layer, a second inorganic encapsulation layer, and an organic encapsulation layer disposed between the first inorganic encapsulation layer and the second inorganic encapsulation layer;
a non-display area disposed outside the display area;
a first planarization layer extending from the display area into the non-display area and disposed between the substrate and the first electrode;
a second planarization layer extending from the display area into the non-display area and disposed on the first planarization layer;
a pixel-defining layer covering at least one edge of the first electrode, extending from the display area into the non-display area, and disposed on the second planarization layer;
a plurality of holes disposed in the non-display area,
wherein each of the holes comprises an opening that passes through the second planarization layer and the pixel-defining layer; and
a first etching prevention layer disposed on the first planarization layer under the holes, wherein
the intermediate layer and the second electrode extend into the non-display area and are disposed inside each of the holes,
the first inorganic encapsulation layer extends into the non-display area and covers an entirety of the second electrode inside each of the holes and inner surfaces of each of the holes, and
an entirety of each of the holes is filled by the organic encapsulation layer.

17. The display apparatus of claim 16, further comprising:
a first dam part and a second dam part each comprising at least one layer comprising a same material as the second planarization layer and the pixel-defining layer, wherein
the first inorganic encapsulation layer extends from the holes and covers the first dam part and the second dam part, and is in direct contact with the second inorganic encapsulation layer outside the second dam part.

18. A method of manufacturing a display apparatus, the method comprising:

forming a first planarization layer on a substrate;
forming a first etching prevention layer on the first planarization layer;
forming a second planarization layer on the first etching prevention layer;
forming a pixel-defining layer on the second planarization layer; and
forming a plurality of first holes that pass through the second planarization layer and the pixel-defining layer in a display area, wherein
the display area is disposed on the substrate and comprises a plurality of pixels,
each of the pixels comprises a first electrode, a second electrode, and an intermediate layer comprising an emission layer and disposed between the first electrode and the second electrode,
the display apparatus comprises a thin-film encapsulation layer encapsulating the display area and comprising a first inorganic encapsulation layer, a second inorganic encapsulation layer, and an organic encapsulation layer disposed between the first inorganic encapsulation layer and the second inorganic encapsulation layer,
the intermediate layer and the second electrode are formed on a top surface of the first etching prevention layer and a top surface of the pixel-defining layer, and
the first inorganic encapsulation layer covers an entirety of the second electrode inside each of the first holes and inner surfaces of each of the first holes, and an entirety of each of the first holes is filled by the organic encapsulation layer.

19. The method of claim 18, further comprising:
forming a first contact hole in the pixel-defining layer; and
forming a barrier layer on the pixel-defining layer, wherein
the barrier layer surrounds the first contact hole, and
the first holes are formed by dry etching the second planarization layer and the pixel-defining layer.

20. The method of claim 19, further comprising:
removing the barrier layer by wet etching after the first holes are formed.

21. The method of claim 19, further comprising:
forming a second etching prevention layer between the second planarization layer and the pixel-defining layer.

22. The method of claim 21, wherein
the second etching prevention layer is formed simultaneously with the first electrode.

23. The method of claim 22, further comprising:
forming a third etching prevention layer on the second etching prevention layer.

24. The method of claim 18, further comprising:
forming a plurality of second holes that pass through the second planarization layer and the pixel-defining layer; and
forming a second etching prevention layer on a bottom surface of each of the second holes and on the first planarization layer,
wherein the first planarization layer, the second planarization layer, and the pixel-defining layer extend into a non-display area disposed outside the display area.

25. The method of claim 24, wherein
the intermediate layer and the second electrode are formed on a top surface of the second etching prevention layer and a top surface of the pixel-defining layer, and
the first inorganic encapsulation layer covers an entirety of the second electrode inside each of the second holes and inner surfaces of each of the second holes, and an entirety of each of the second holes is filled by the organic encapsulation layer.

26. The method of claim 18, wherein
the first holes are formed by irradiating a location corresponding to the first etching prevention layer with a laser.

* * * * *